(12) United States Patent
Segawa et al.

(10) Patent No.: US 6,456,170 B1
(45) Date of Patent: Sep. 24, 2002

(54) COMPARATOR AND VOLTAGE CONTROLLED OSCILLATOR CIRCUIT

(75) Inventors: Yuji Segawa; Masaru Otsuka; Osamu Kikuchi; Akira Haga; Yoshinori Yoshikawa, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/538,720

(22) Filed: Mar. 30, 2000

(30) Foreign Application Priority Data

Jun. 1, 1999 (JP) .......................................... 11-153590
Jun. 1, 1999 (JP) .......................................... 11-153591

(51) Int. Cl.$^7$ ............................................... H03L 7/00
(52) U.S. Cl. ......................... 331/143; 331/111; 327/50; 327/54; 327/56; 327/57
(58) Field of Search ............................... 331/111, 143, 331/57; 327/50, 54, 56, 57

(56) References Cited

U.S. PATENT DOCUMENTS

| | | | |
|---|---|---|---|
| 4,410,813 A | 10/1983 | Barker et al. ................ | 307/362 |
| 4,791,318 A | 12/1988 | Lewis et al. ................ | 307/297 |
| 5,017,811 A | 5/1991 | Worley ........................ | 307/475 |
| 5,329,184 A | 7/1994 | Redfern ....................... | 307/475 |
| 5,668,508 A | * 9/1997 | Pulvirenti et al. .......... | 331/111 |
| 5,701,105 A | * 12/1997 | Park ............................ | 331/153 |
| 5,769,873 A | 6/1998 | Zadeh .......................... | 607/29 |
| 5,793,257 A | 8/1998 | Inanami et al. ............... | 331/17 |
| 5,870,000 A | 2/1999 | Matsuda et al. .............. | 331/31 |

FOREIGN PATENT DOCUMENTS

| | | |
|---|---|---|
| EP | 0 735 677 A1 | 10/1996 |
| JP | 63 301618 | 8/1988 |

* cited by examiner

*Primary Examiner*—Arnold Kinkead
(74) *Attorney, Agent, or Firm*—Arent Fox Kintner Plotkin & Kahn, PLLC

(57) ABSTRACT

The inverter functioning as a comparator, dummy inverter having the same electric characteristics as the inverter, and control circuit are provided. Vth detecting input voltage output from the control circuit is input into the dummy inverter, Vth detecting output voltage output from the dummy inverter is input into the control circuit, and the threshold voltage of the dummy inverter is detected. The threshold voltage of the inverter is controlled by controlling the back gate voltages of the MOS transistors of the dummy inverter and the inverter in such a manner that the threshold voltage of the dummy inverter coincide with an external reference voltage.

5 Claims, 21 Drawing Sheets

COMPARATOR AND VOLTAGE CONTROLLED OSCILLATOR CIRCUIT

FIELD OF THE INVENTION

The present invention relates to a comparator, and in particular to a comparator adapted to control the threshold voltage of an inverter. Furthermore, this invention relates to a voltage controlled oscillator circuit, and in particular to a voltage controlled oscillator circuit which oscillates at a high frequency.

BACKGROUND OF THE INVENTION

Comparators are used in analog circuits such as VCO (voltage controlled oscillator circuits) forming PLL (phase-locked loops) which are used in portable radio devices and for clock frequency conversion. Recently, speed of analog circuits is increasing more and more. As a result, a short delay time and a high speed characteristic are required of comparators.

Voltage controlled oscillator circuits are used as components of PLL (phase-locked loops) used in portable radio devices and for clock frequency conversion. Sometimes the voltage controlled oscillator circuit incorporates two comparators. The oscillation frequency of the voltage controlled oscillator circuit is influenced by the delay time of the incorporated comparator. Accordingly, for obtaining a voltage controlled oscillator circuit having a high oscillation frequency, it is necessary to use a comparator which operates at high speed.

FIGS. 1, 2 and 3 shows circuit symbol, circuit, and output characteristic of a conventional comparator of inverter type, respectively. The conventional comparator 11 is formed of a CMOS inverter including a PMOS transistor Q1 and an NMOS transistor Q2. Input voltage Vin is input into gates of these transistors Q1 and Q2. Output voltage Vout is output from the drains of the transistors Q1 and Q2 connected in common.

This comparator 11 formed of the CMOS inverter has an operation delay time of a few nanoseconds, which is quite short, and therefore it operates at a high speed. Reference voltage of the comparator 11, i.e., a voltage serving as a reference voltage for comparing the magnitude of the input voltage is the threshold voltage of the transistors Q1 and Q2. When the input voltage Vin is lower than the threshold voltage Vth as shown in FIG. 3, the PMOS transistor Q1 turns on and consequently the output voltage Vout becomes "H" level which is relatively high in potential. On the other hand, when the input voltage Vin is higher than the threshold voltage Vth, NMOS transistor Q2 turns on and consequently the output voltage Vout becomes "L" level which is relatively low in potential.

FIGS. 4, 5 and 6 shows a circuit symbol, circuit, and output characteristic of a conventional differential comparator, respectively. This comparator 12 has a configuration obtained by combining a differential amplifier circuit with a single-ended amplifier circuit. The differential amplifier circuit includes PMOS transistors Q3 and Q4, NMOS transistors Q5 and Q6, and a current source 13. The single-ended amplifier circuit includes a PMOS transistor Q7 and an NMOS transistor Q8.

Gates of the NMOS transistors Q5 and Q6 are supplied with a reference voltage VR and an input voltage Vin, respectively. A drain output of the transistor Q6 is input into gates of the PMOS transistor Q7 and the NMOS transistor Q8. Output voltage Vout is output from the drains of the transistors Q7 and Q8 connected in common.

Since the differential amplifier circuit is used in this differential comparator 12, the input voltage Vin can be compared with the reference voltage VR accurately. In other words, when the input voltage Vin is lower than the reference voltage VR, then the drain output of the transistor Q6 is "H" level, the NMOS transistor Q8 turns on, and therefore the output voltage Vout becomes "L" level as shown in FIG. 6. On the other hand, when the input voltage Vin is higher than the reference voltage VR, then the drain output of the transistor Q6 is "L"level, the PMOS transistor Q7 turns on, and therefore the output voltage Vout becomes "H" level.

FIG. 7 is a circuit diagram of a conventional comparator of chopper type (hereinafter, comparator). This comparator includes inverter 14, capacitor 15, latch circuit 16, and first through third switches 17, 18 and 19. The first and second switches 17 and 18 are controlled by a clock signal Φ so as to turn on/off. The third switch 19 is controlled by an inverted signal /Φ of the clock signal Φ (where "/" represents a bar indicating inversion) so as to turn on/off.

FIG. 8 is an operation timing diagram of the chopper comparator shown in FIG. 7. When the clock signal Φ is "H" level (in other words, when /Φ is "L" level), the first and second switches 17 and 18 turn on, resulting in auto zero operation. During the period when this auto zero operation is being carried out, voltages V1 and V2 respectively at nodes located on input and output sides of the inverter 14 become a threshold voltage Vth of the inverter, and a potential difference between this threshold voltage Vth and the reference voltage VR is stored in the capacitor 15.

When the clock signal Φ is "H" level (in other words, when /Φ is "H" level), the third switch 19 turns on and a comparison operation is performed. During the period when this comparison operation is being carried out, if the input voltage Vin is higher than the reference voltage VR then the output voltage V2 of the inverter 14 becomes "L" level. In synchronism with the next rising edge of the clock signal, this is output from the latch circuit 16 as an output voltage Vout of "L" level. On the other hand, during the period the comparison operation is being carried out, if the input voltage Vin is lower than the reference voltage VR then the output voltage V2 of the inverter 14 becomes "H" level. In synchronism with the next rising edge of the clock signal, this is output from the latch circuit 16 as an output voltage Vout of "H" level.

FIG. 9 is a circuit diagram of an oscillator circuit comprising two comparators. This oscillator circuit 2 includes first and second comparators 21a and 21b, capacitor 22 charged or discharged to supply a comparison voltage Vc to the first and second comparators 21a and 21b, first and second current sources 23a and 23b for charging or discharging the capacitor 22, first and second switches 24a and 24b and inverter 25 for respectively controlling on/off of the first and second current sources 23a and 23b, and latch circuit composed of two NAND gates 27a and 27b for latching a signal obtained by inverting an output signal of the first comparator 21a by means of inverter 26 and an output signal of the second comparator 21b and outputting an oscillation signal as an output voltage Vout.

The first comparator 21a is supplied with a voltage signal which is relatively high in potential (hereafter referred to as high reference voltage VRH) as a reference voltage. The second comparator 21b is supplied with a voltage signal which is relatively low in potential (hereafter referred to as low reference voltage VRL) as a reference voltage. The first switch 24a is controlled by the output signal of the latch circuit, i.e., the oscillation signal. The second switch 24b is controlled by a signal obtained by inverting the oscillation signal using the inverter 25.

FIG. 10 is an operation timing diagram of the oscillator circuit 2 shown in FIG. 9. When a terminal voltage VC, the voltage that increases due to charging, of the capacitor 22 exceeds the high reference voltage VRH, the first comparator 21a performs comparison operation after a delay time td. As a result, an output voltage of the inverter 26 (a voltage at a node A located on an output side of the inverter 26) supplied with an output signal of the comparator 21a is switched from "H" level to "L" level. Accordingly, the latch circuit is reset, and the output voltage Vout of the latch circuit is switched from "H" level to "L" level.

Furthermore, when the terminal voltage of the capacitor 22, i.e., the comparison voltage Vc is lowered due to discharging below the low reference voltage VRL, the second comparator 21b performs comparison operation after a delay time td. As a result, an output voltage of the comparator 21b (a voltage at a node B located on an output side of the comparator 21b) supplied with an output signal of the comparator 21a is switched from "H" level to "L" level. Accordingly, the latch circuit is reset, and the output voltage Vout of the latch circuit is switched from "H" level to "L" level.

FIG. 11 is a schematic diagram showing the configuration of a conventional voltage controlled oscillator circuit. This voltage controlled oscillator circuit includes first and second differential comparators 110 and 111, a capacitor 112 for supplying a comparison voltage Vc to the first and second comparators 110 and 111, first and second current sources 113 and 114 for charging or discharging the capacitor 112, converter circuit 115 for making each of the first and second current sources 113 and 114 generate a current proportionate to the input voltage, first and second switches 116 and 117 and inverter 118 for respectively controlling on/off of the first and second current sources 113 and 114, and latch circuit 119 for latching output signals of the first and second comparators 110 and 111 and outputting an oscillation signal of the voltage controlled oscillator circuit.

Voltage Vin is input into the converter circuit 115 as a control voltage input from the outside to control the oscillation frequency of the voltage controlled oscillation circuit shown in FIG. 11. The converter circuit 115 controls the first and second current sources 113 and 114, and makes each of the first and second current sources 113 and 114 to generate a current I proportionate to the input voltage Vin.

The first and second current sources 113 and 114 are driven on the basis of an output of the converter circuit 115 and generate the current I proportionate to the input voltage Vin. The positive terminal of the first current source 113 is connected to a power supply, and the negative terminal is connected to the first switch 116. The positive terminal of the second current source 114 is connected to the second switch 117, and the negative terminal is connected to the ground.

The first and second switches 116 and 117 are connected in series. Between the power supply terminal and the ground, therefore, the first current source 113, the first switch 116, the second switch 117, and the second current source 114 are connected in series.

The first switch 116 and the second switch 117 turn on/off on the basis of an output voltage Vout of the latch circuit 119, i.e., the oscillation signal of the voltage controlled oscillator circuit shown in FIG. 11. However, the first switch 116 and the second switch 117 are supplied with the oscillation signal of the voltage controlled oscillator circuit at phases shifted from each other by 180 degrees in order to prevent both the first switch 116 and the second switch 117 from turning on simultaneously, i.e., in order to make either the first switch 116 or the second switch 117 turn on exclusively. Precisely, for example, the oscillation signal of the voltage controlled oscillator circuit is input into the first switch 116 as it is, whereas the oscillation signal of the voltage controlled oscillator circuit is inverted by the inverter 118 and then input into the second switch 117.

A node between the first switch 116 and the second switch 117 is connected to one terminal of the capacitor 112, and further connected to non-inverting input terminals of the first and second comparators 110 and 111. Other terminal of the capacitor 112 is connected to the ground. Therefore, the current of the first current source 113 (when the first switch 116 is closed) charges the capacitor 112. A voltage Vc generated by this charging is applied to the non-inverting input terminals of the first and second comparators 110 and 111 as comparison voltage.

On the other hand, when the second switch 117 is closed, the capacitor 112 is discharged by the current dragged by the second current source 114. A voltage Vc generated by this discharging is applied to the non-inverting input terminals of the first and second comparators 110 and 111 as a comparison voltage.

The first comparator 110 is supplied with a reference voltage VRH which is relatively high in potential level (hereafter referred to as high reference voltage VRH) as an input signal of an inverting input terminal thereof. The first comparator 110 compares the high reference voltage VRH with the comparison voltage Vc. The output terminal of the first comparator 110 is connected to a reset terminal "Reset" of the latch circuit 119.

The second comparator 111 is supplied with a reference voltage VRL which is relatively low in potential level (hereafter referred to as low reference voltage VRL) as an input signal of an inverting input terminal thereof. The second comparator 111 compares the low reference voltage VRL with the comparison voltage Vc. The output terminal of the second comparator 111 is connected to a set terminal "/Set" of the latch circuit 119. This set terminal "/Set" becomes effective when the input signal is at a relatively low potential level.

Operation of the voltage controlled oscillator circuit shown in FIG. 11 will now be described. FIG. 12 is a timing chart of the operation. In such a state that the first switch 116 is open (off) and the second switch 117 is closed (on), the second current source 114 draggers the current so that the capacitor 112 is discharged. Therefore, the terminal voltage of the capacitor 112, i.e., the comparison voltage Vc of the first and second comparators 110 and 111 gradually falls.

During this period, the output voltage of the first comparator 110 becomes a relatively low potential level (hereafter referredtoas "L"level), whereas the output voltage of the second comparator 111 becomes a relatively high potential level (hereafter referred to as "H" level). Therefore, the latch circuit 119 keeps its output voltage Vout, i.e., the oscillation signal of the voltage controlled oscillator circuit at "L" level which is the previous state. In FIG. 12, changes in the output voltages of the first and second comparators 110 and 111 are shown as voltage changes at the nodes A and B (output terminals of the first and second comparators 110 and 111) shown in FIG. 11.

When the comparison voltage Vc further falls and becomes equal to (at time T1) or less than the low reference voltage VRL, the output voltage of the second comparator 111 switches to "L" level. As a matter of fact, however, a delay is caused in the operation of the second comparator 111. Therefore, the output voltage of the second comparator 111 switches to "L" level when a delay time td has elapsed (at time T2) since the time when the comparison voltage Vc has become equal to or less than the low reference voltage VRL (at time T1).

At this time, the output voltage of the first comparator 110 remains at "L" level. Therefore, the latch circuit 119 is set, and the output voltage Vout of the latch circuit 119 switches to "H" level at time T2.

Since the output voltage Vout of the latch circuit 119 switches to "H" level, the second switch 117 turns off and the first switch 116 closes (turns on) at time T2. As a result, a current of the first current source 113 flows, and the capacitor 112 begins to be charged due to this current.

Therefore, the terminal voltage of the capacitor 112, i.e., the comparison voltage Vc of the first and second comparators 110 and 111 begins to rise. When the comparison voltage Vc exceeds the low reference voltage VRL (at time T3), the output voltage of the second comparator 111 switches to "H" level. As a matter of fact, however, a delay is caused in the operation of the second comparator 111. Therefore, the output voltage of the second comparator 111 switches to "H" level when a delay time td has elapsed (at time T4) since time T3.

At this time, the output voltage of the first comparator 110 remains at "L" level. Therefore, the latch circuit 119 keeps its output voltage Vout at "H" level. When the terminal voltage of the capacitor 112, i.e., the comparison voltage Vc further rises and exceeds the high reference voltage VRH (at time T5), the output voltage of the first comparator 110 switches to "H" level.

As a matter of fact, however, a delay is caused in the operation of the first comparator 110. Therefore, the output voltage of the first comparator 110 switches to "H" level when a delay time td has elapsed (at time T6) since time T5. At this time, the output voltage of the second comparator 111 remains at "H" level. Therefore, the latch circuit 119 is reset, and the output voltage Vout switches to "L" level at time T6.

Since the output voltage Vout of the latch circuit 119 switches to "L" level, the first switch 116 turns off and the second switch 117 closes (turns on) again at the time T6. As a result, the capacitor 112 begins to be discharged due to the current of the second current source 114. Therefore, the terminal voltage of the capacitor 112, i.e., the comparison voltage Vc of the first and second comparators 110 and 111 begins to fall.

When the comparison voltage Vc has become equal to or less than the high reference voltage VRH (at time T7), the output voltage of the comparator 110 switches to "L" level. As a matter of fact, however, a delay is caused in the operation of the first comparator 110. Therefore, the output voltage of the first comparator 110 switches to "L" level when a delay time td has elapsed (at time T8) since time T7.

At this time, the output voltage of the second comparator 111 remains at "H" level. Therefore, the latch circuit 119 keeps its output voltage Vout at "L" level. The voltage controlled oscillator circuit shown in FIG. 11 repeats such operation.

Assuming the change in the comparison voltage Vc per unit time Δt to be ΔV, a period T of the voltage controlled oscillator circuit shown in FIG. 11 is represented by the following equation (1).

$$T=\{2 \cdot (VRH-VRL)/(\Delta V/\Delta t)\}+4 \cdot td \quad (1)$$

Assuming the capacitance of the capacitor 112 to be C, and the current flowing through the first and second current sources 113 and 114 to be I, ΔV/Δt in the equation (1) is represented by the following equation (2).

$$(\Delta V/\Delta t)=I/C \quad (2)$$

The converter circuit 115 makes the first and second current sources 113 and 114 let flow the current I proportionate to the input voltage Vin. Assuming the constant of proportionality between the input voltage Vin and the current I to be K, the current I is represented by the following equation (3). From the equation (3), therefore, the equation (2) can be rewritten as represented by the following equation (4). Finally, the equation (1) can be rewritten as represented by the following equation (5).

$$I=K \cdot Vin \quad (3)$$

$$\Delta V/\Delta t=K \cdot Vin/C \quad (4)$$

$$T=\{2 \cdot (VRH-VRL)/(K \cdot Vin)\}+4 \cdot td \quad (5)$$

For example, in the case of the oscillator circuit having the configuration shown in FIG. 9, it is necessary to perform comparison between the comparison voltage and the high and low reference voltages VRH and VRL accurately at high speed for generating a fast and accurate oscillation frequency. Furthermore, in the oscillator circuit 2, it is impossible to synchronize the timing when the comparison voltage Vc becomes equal to the high reference voltage VRH or low reference voltage VRL with an external clock.

The reason for this is as follows. When an external clock is used in the oscillator circuit 2, edges of the oscillation are synchronized to this clock. This results in inconvenience such as dispersion in oscillation periods or discontinuity in period setting. Therefore, in the oscillation circuit 2 having the configuration shown in FIG. 9, it is necessary that the first and second comparators 21a and 21b perform the comparison operation continuously.

In the conventional comparator of inverter type explained with reference to FIGS. 1 through 3, however, the threshold voltage determined by characteristics of the PMOS and NMOS transistors Q1 and Q2 serves as the reference voltage. This results in a problem that the reference voltage, i.e., the threshold voltage is extremely inaccurate because of factors such as dependence upon power supply voltage, dependence upon temperature, and dependence upon sampling. Therefore, it is difficult to perform accurate comparison operation using the conventional comparator of inverter type. Therefore, this comparator is inappropriate to the above described oscillation circuit.

Furthermore, in the conventional differential comparator explained with reference to FIGS. 4 through 6, its operation speed is restricted by the operation speed of the differential amplifier circuit. For example, in the case where the differential amplifier circuit has a CMOS configuration, therefore, the delay time becomes as long as several tens nanoseconds. Therefore, it is difficult to perform comparison operation at high speed using the conventional differential comparator. Therefore, this comparator is also inappropriate to the above described oscillation circuit.

Furthermore, in the conventional chopper comparator explained with reference to FIGS. 7 and 8, auto zero operation is performed during an interval of half a period of the clock signal Φ, and consequently the comparison operation cannot be performed during that interval. As a result, the conventional comparator of chopper type cannot be used when performing comparison in an a synchronous manner. Therefore, the conventional chopper comparator is also inappropriate to the above described oscillation circuit.

Furthermore, as represented by the equation (5), the period T of the voltage controlled oscillator circuit becomes longer than the original oscillation period by four times (4·td) the delay time td of the first and second comparators 110 and 111. In calculation, therefore, a maximum value of the oscillation frequency (reciprocal of the period T) of the voltage controlled oscillator circuit becomes a frequency represented by a reciprocal of 4·td.

The delay time td of a typical differential comparator is approximately 50 ns. In the conventional voltage controlled oscillator circuit, therefore, upper limit of its oscillation frequency is approximately 20 MHz in calculation. In the actual circuit design, therefore, the oscillation frequency must be suppressed to approximately 10 MHz. This frequency is insufficient for operating the voltage controlled oscillator circuit at high speed.

SUMMARY OF THE INVENTION

The present invention has been achieved in view of the above described problems. It is an object of the present invention to provide a comparator capable of performing fast and accurate comparison operations continuously. It is an another object of the present invention to provide a faster voltage controlled oscillator circuit capable by using a faster chopper comparator.

FIG. 13 is a diagram illustrating the principle of a comparator according to the present invention. This comparator 3 includes inverter 31, dummy inverter 32, and control circuit 33. The inverter 31 functions to compare input voltage Vin with the threshold voltage Vth serving as a reference voltage at the time of comparison, and output the output voltage Vout. The control circuit 33 functions to control the threshold voltages Vth of the inverter 31 and the dummy inverter 32.

The inverter 31 and the dummy inverter 32 are adapted to be controlled for their threshold voltage Vth by a Vth control voltage Vtc output from the control circuit 33. The inverter 31 and the dummy inverter 32 have the same configuration, and they are disposed in close vicinity to each other and are fabricated on the same semiconductor substrate by using the same process. Therefore, their electric characteristics, for example, their threshold voltages Vth can be regarded to be approximately equal.

The dummy inverter 32 is supplied with a Vth detecting input voltage Vin' output from the control circuit 33. The dummy inverter 32 outputs a Vth detecting output voltage Vout' to the control circuit 33. The control circuit 33 generates the Vth detecting input voltage Vin' and outputs it to the dummy inverter 32. In addition, the control circuit 33 receives the Vth detecting output voltage Vout' from the dummy inverter 32. The control circuit 33 is supplied with a reference voltage VR from outside.

Operation of the comparator 3 having the configuration as shown in FIG. 13 will now be described. The control circuit 33 supplies the Vth detecting input voltage Vin' to the dummy inverter 32. The dummy inverter 32 outputs the Vth detecting output voltage Vout' based on the Vth detecting input voltage Vin' and the threshold voltage Vth. The control circuit 33 detects the threshold voltage Vth of the dummy inverter 32 based on the Vth detecting output voltage Vout' and the Vth detecting input voltage Vin'.

The control circuit 33 compares in magnitude the detected threshold voltage Vth of the dummy inverter 32 with the reference voltage VR input from the outside. On the basis of a result of the comparison, the control circuit 33 adjusts a Vth control voltage Vtc so as to make the threshold voltage Vth of the dummy inverter 32, i.e., the threshold voltage Vth of the inverter 31 serving as a comparator coincide with the external reference voltage VR. The control circuit 33 outputs the Vth control voltage Vtc to the dummy inverter 32 and the inverter 31.

As a result, the threshold voltage Vth of the inverter 31 and the dummy inverter 32 becomes coincides with the fixed reference voltage VR. Therefore, it becomes possible to use the inverter 31 as a comparator for performing comparison operation at high precision. Furthermore, since the delay time of the inverter 31 is as small as a few nanoseconds, a faster comparator is realized. Furthermore, since the inverter 31 can operate continuously, it can be used also in the case where comparison is performed a synchronously.

The principle of the fact that the threshold voltage Vth of the inverter 31 and the dummy inverter 32 can be controlled using the Vth control voltage Vtc output from the control circuit 33 will now be described by referring to FIG. 14. As for the threshold voltage of an NMOS transistor (as well as a PMOS transistor), the threshold voltage Vthn of an NMOS transistor with respect to a reference voltage is a function of a back gate voltage VBn of the NMOS transistor, and it can be represented by the following equation (6).

$$Vthn\ (VBn)=Vthn+\Delta Vthn\ (VBn) \qquad (6)$$

The $\Delta Vthn$ (VBn) in equation (6) is represented by the following equation (7). In equation (7), Kn and $\Phi Fn$ are coefficients depending upon the fabrication process of the transistor or the temperature.

$$\Delta Vthn\ (VBn)=Kn\ (\sqrt{(2\cdot\Phi Fn-VBn)}-\sqrt{(2\cdot\Phi Fn)}) \qquad (7)$$

Representing the threshold voltage of a PMOS transistor with respect to a substrate voltage by Vthp, a back gate voltage of the PMOS transistor by VBp, and the ratio of a current amplification factor βn of the NMOS transistor to a current amplification factor βp of the PMOS transistor by βR (βR=βn/βp), the threshold voltage Vth of the inverter is represented by the following equation (8). The VDD in equation (8) is a power supply voltage.

$$Vth=(VDD-|Vthp(VBn)|+Vthn(VBp)\cdot\sqrt{\beta R})/(1+\sqrt{\beta R}) \qquad (8)$$

From this equation (8), it will be understood that the threshold voltage of the inverter can be controlled by controlling the back gate voltage VBn of the NMOS transistor and/or the back gate voltage VBp of the PMOS transistor. In the present invention, therefore, the back gate voltage of the NMOS transistor and the PMOS transistor forming each of the inverter 31 and the dummy inverter 32 may be controlled in order to control the threshold voltage of the inverter 31 and the dummy inverter 32.

FIG. 22 is a schematic diagram showing a circuit configuration for description of a principle of a voltage controlled oscillator circuit according to the present invention. FIG. 23 is a timing chart illustrating operation of the voltage controlled oscillator circuit.

As shown in FIG. 22, a voltage controlled oscillator circuit according to the present invention includes two chopper comparators 120 and 121 (a first chopper comparator and a second chopper comparator), capacitor 122 for supplying a comparison voltage Vc to the two comparators 120 and 121, first and second current sources 123 and 124 for charging or discharging the capacitor 122, and converter circuit 125 for making the first and second current sources 123 and 124 generate a current I proportionate to input voltage Vin.

The voltage controlled oscillator circuit further includes first and second switches 126 and 127 and inverter 128 for controlling on/off of the first and second current sources 123 and 124. A logic circuit 129 latches the output signals of the first and second comparators 120 and 121, outputs the output voltage Vout that serves as an oscillation signal of the voltage controlled oscillator circuit according to the present invention, and generates clock signals Φ1 and /Φ1 (where /Φ1 is an inverted signal of Φ1) for switching operation of the first and second chopper comparators 120 and 121. This logic circuit 129 has a function of an output switching circuit.

The converter circuit 125 is supplied with, as its input voltage Vin, a control voltage input from the outside in order to control an oscillation frequency of a voltage controlled oscillator circuit according to the present invention. The converter circuit 125 controls the first and second current sources 123 and 124, and makes each of the first and second current sources 123 and 124 to generate a current I proportionate to the input voltage Vin.

The first and second current sources 123 and 124 are driven on the basis of an output of the converter circuit 125 and generate the current I proportionate to the input voltage Vin. The positive terminal of the first current source 123 is connected to a power supply terminal, and the negative terminal is connected to the first switch 126. The positive terminal of the second current source 124 is connected to the second switch 127, and the negative terminal is connected to the ground.

The first and second switches 126 and 127 are connected in series. Between the power supply terminal and the ground, therefore, the first current source 123, the first switch 126, the second switch 127, and the second current source 124 are connected in series.

The first switch 126 and the second switch 127 turn on/off on the basis of an output voltage Vout of the logic circuit 129, i.e., the oscillation signal of the voltage controlled oscillator circuit according to the present invention. However, the first switch 126 and the second switch 127 are supplied with an input signal for their on/off control, i.e., the oscillation signal of the voltage controlled oscillator circuit at phases shifted from each other by 180 degrees in order to prevent both the first switch 126 and the second switch 127 from turning on simultaneously, i.e., in order to make either the first switch 126 or the second switch 127 turn on exclusively.

Precisely, for example, the oscillation signal of the voltage controlled oscillator circuit is input into the first switch 126 as it is, whereas the oscillation signal of the voltage controlled oscillator circuit is inverted by the inverter 128 and then input into the second switch 127.

A node between the first switch 126 and the second switch 127 is connected to one terminal of the capacitor 122, and further connected to non-inverting input terminals of the first and second comparators 120 and 121.

Other terminal of the capacitor 122 is connected to the ground. When the first switch 126 is closed (on), therefore, the capacitor 122 is charged due to the current of the first current source 123. A voltage Vc generated by this charging is applied to the first and second comparators 120 and 121 as a comparison voltage. On the other hand, when the second switch 127 is closed (on), the capacitor 122 is discharged due to the current dragged by the second current source 124. A voltage Vc generated by this discharging is applied to the first and second comparators 120 and 121 as a comparison voltage.

The first and second chopper comparators 120 and 121 are adapted to be alternately switched from a comparison operation state to an auto zero state and vice versa by the clock signals Φ1 and /Φ1. For example, when the clock signal Φ1 is "H" level, the first comparator 120 supplied with a reference voltage VRH which is relatively high in potential level performs comparison operation. On the other hand, the second comparator 121 supplied with a reference voltage VRL which is relatively low in potential level is in the auto zero state.

In this state, the first switch 126 is closed and the second switch 127 is open. As a result, the capacitor 122 is charged. Therefore, the terminal voltage of the capacitor 122, i.e., the comparison voltage Vc of the first and second comparators 120 and 121 gradually rises. Therefore, it is sufficient that the first comparator 120 having the reference voltage VRH compares the comparison voltage Vc with the threshold voltage VRH. Thus, even if the second comparator 121 having the reference voltage VRL is in the auto zero state, there occurs no inconvenience at all.

In contrast with this, when the clock signal Φ1 is "L" level, the first comparator 120 supplied with the reference voltage VRH is in the auto zero state. On the other hand, the second comparator 121 supplied with the reference voltage VRL performs comparison operation. In this state, the first switch 126 is open (off) and the second switch 127 is closed (on). As a result, the capacitor 122 is discharged. Therefore, the terminal voltage of the capacitor 122, i.e., the comparison voltage Vc of the first and second comparators 120 and 121 gradually falls.

Therefore, it is sufficient that the second comparator 121 having the reference voltage VRL compares the comparison voltage Vc with the threshold voltage VRL. Thus, even if the first comparator 120 having the reference voltage VRH is in the auto zero state, there occurs no inconvenience at all.

The logic circuit 129 incorporates a latch circuit for latching the output signals of the first and second comparators 120 and 121. This latch circuit is not illustrated. In addition, the logic circuit 129 incorporates a clock signal generation circuit for generating the clock signals Φ1 and /Φ1. This clock signal generation circuit is also not illustrated. The clock signal generation circuit generates the clock signal Φ1 in synchronism with and with a slight delay as compared with an output voltage Vout of the logic circuit 129, i.e., the oscillation signal of the voltage controlled oscillator circuit according to the present invention. The clock signal generation circuit supplies this clock signal Φ1 to the first comparator 120 having the reference voltage VRH.

Furthermore, the clock signal generation circuit shifts the phase of the clock signal Φ1 by 180 degrees and supplies the resultant clock signal to the second comparator 121 having the reference voltage VRL. Therefore, the clock signal generation circuit of the logic circuit 129 has a function of a delay circuit for delaying the output voltage Vout of the logic circuit 129 by a predetermined time and outputting the delayed signal.

Operation of the voltage controlled oscillator circuit shown in FIG. 22 will now be described by referring to FIG. 23. In such a state that the first switch 126 is open (off) and the second switch 127 is closed (on), the second current source 124 drags the current so that the capacitor 122 is discharged. Therefore, the terminal voltage of the capacitor 122, i.e., the comparison voltage Vc of the second comparator 121 gradually falls.

In this state, the second comparator 121 having the reference voltage VRL performs the comparison operation, whereas the first comparator 120 having the reference voltage VRH is in the auto zero state. The output voltage of the second comparator 121 is "H" level, and the output voltage Vout of the logic circuit 129 becomes "L" level. In FIG. 23, changes in the output voltages of the first and second comparators 120 and 121 are shown as voltage changes at nodes A and B (output terminals of the first and second comparators 120 and 121) shown in FIG. 22.

When the comparison voltage Vc further falls and becomes equal to or less than the low reference voltage VRL (at time T11) and a delay time caused by the second comparator 121 has elapsed (at time T12), then the output voltage of the second comparator 121 switches to "L" level. Therefore, the output voltage Vout of the logic circuit 129 switches to "H" level at time T12.

Since the output voltage Vout of the logic circuit 129 switches to "H" level, the second switch 127 turns off and the first switch 126 closes (turns on) at time T12. As a result, a current from the first current source 123 flows, and the capacitor 122 begins to be charged by this current.

Therefore, the terminal voltage of the capacitor 122, i.e., the comparison voltage Vc of the first comparator 120 begins to rise. In this state, the first comparator 120 having the reference voltage VRH performs the comparison operation, whereas the second comparator 121 having the reference voltage VRL is in the auto zero state. The output voltage of the first comparator 120 is "L" level, and the output voltage Vout of the logic circuit 129 is "H" level.

When the terminal voltage of the capacitor 122, i.e., the comparison voltage Vc further rises and exceeds the high reference voltage VRH (at time T13), and a delay time caused by the first comparator 120 has elapsed (at time T14), then the output voltage of the first comparator 120 switches to "H" level. Therefore, the output voltage Vout of the logic circuit 129 switches to "L" level at time T14.

Since the output voltage Vout of the logic circuit 129 switches to "L" level, the first switch 126 turns off and the second switch 127 closes (turns on) also at time T14. As a result, the capacitor 122 begins to be discharge again.

Therefore, the terminal voltage of the capacitor 122, i.e., the comparison voltage Vc of the second comparator 121 begins to fall again. The first comparator 120 having the reference voltage VRH is brought into the auto zero state, whereas the second comparator 121 having the reference voltage VRL performs the comparison operation. The output voltage of the second comparator 121 is kept at "H" level, and the output voltage Vout of the logic circuit 129 is "L" level. The voltage controlled oscillator circuit shown in FIG. 22 repeats such operation.

Thus, in the present invention, the comparison between the comparison voltage based upon the control voltage for controlling the oscillation frequency of the voltage controlled oscillation circuit and the reference voltage is performed by the faster chopper comparator. As a result, the voltage controlled oscillator circuit can operate at higher speed.

Other objects and features of this invention will become apparent from the following description with reference to the accompanying drawings.

DESCRIPTION OF THE PREFERRED EMBODIMENTS

Hereafter, an embodiment of a comparator according to the present invention will be described by referring to FIGS. 15 through 21.

Figure 1:
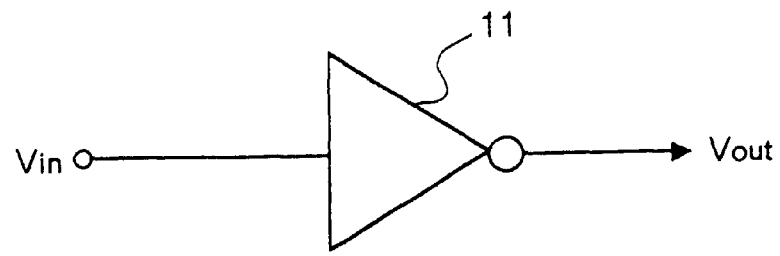
FIG. 1 is a symbolic representation of a conventional comparator of inverter type.
Figure 2:
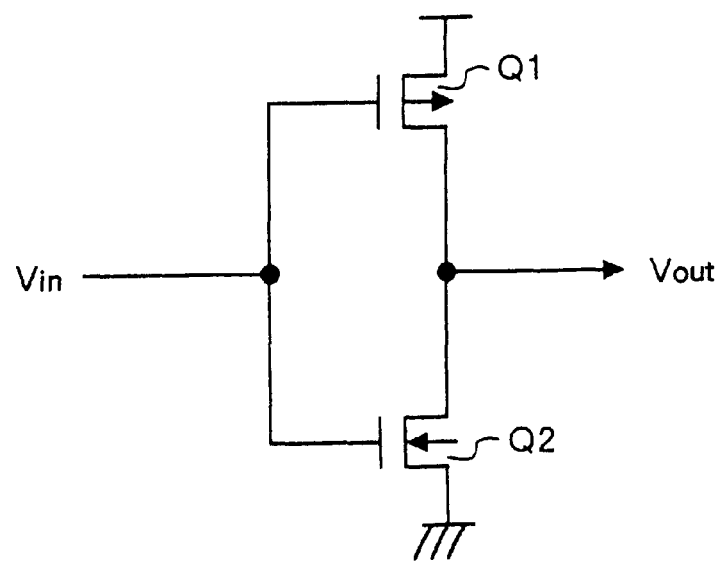
FIG. 2 is a circuit diagram of the conventional comparator of inverter type.
Figure 3:
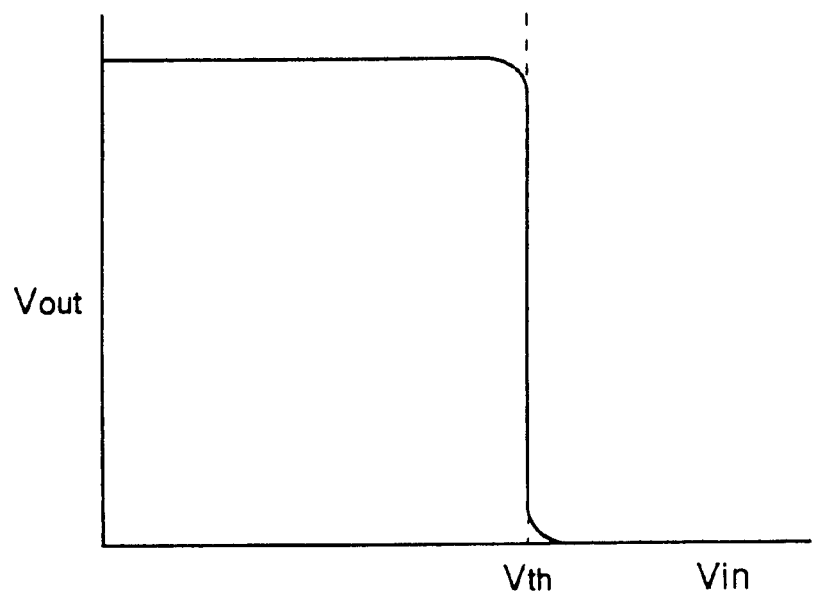
FIG. 3 shows output characteristics of the conventional comparator of inverter type.
Figure 4:
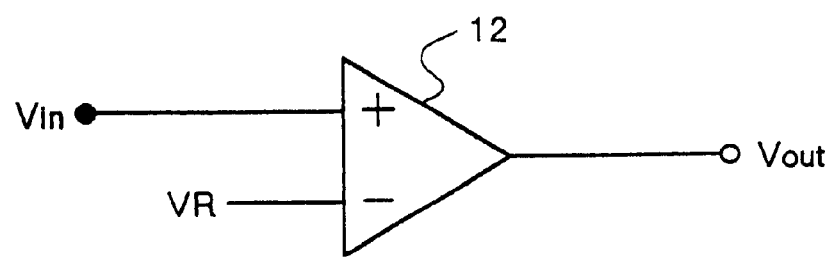
FIG. 4 is a symbolic representation of a conventional differential comparator.
Figure 5:
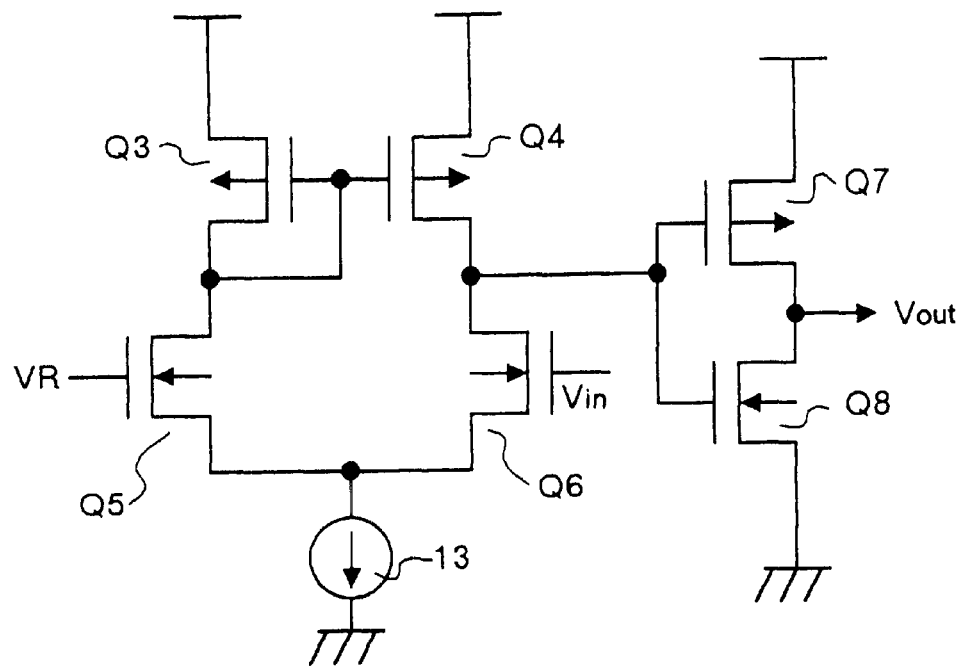
FIG. 5 is a circuit diagram of the conventional differential comparator.
Figure 6:
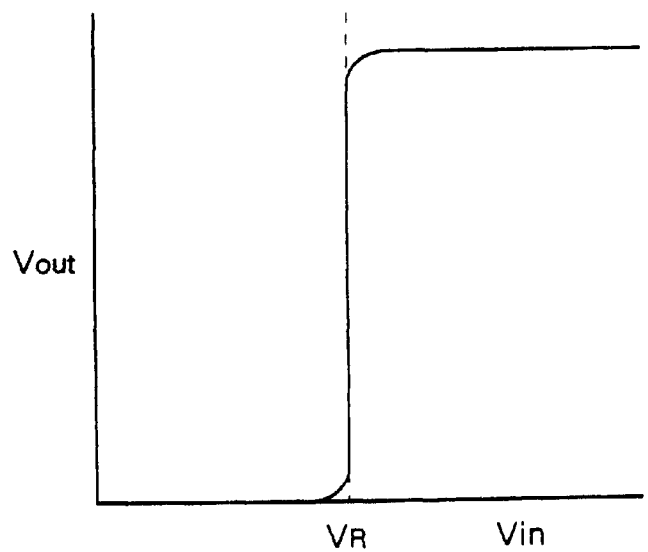
FIG. 6 shows output characteristics of the conventional differential comparator.
Figure 7:
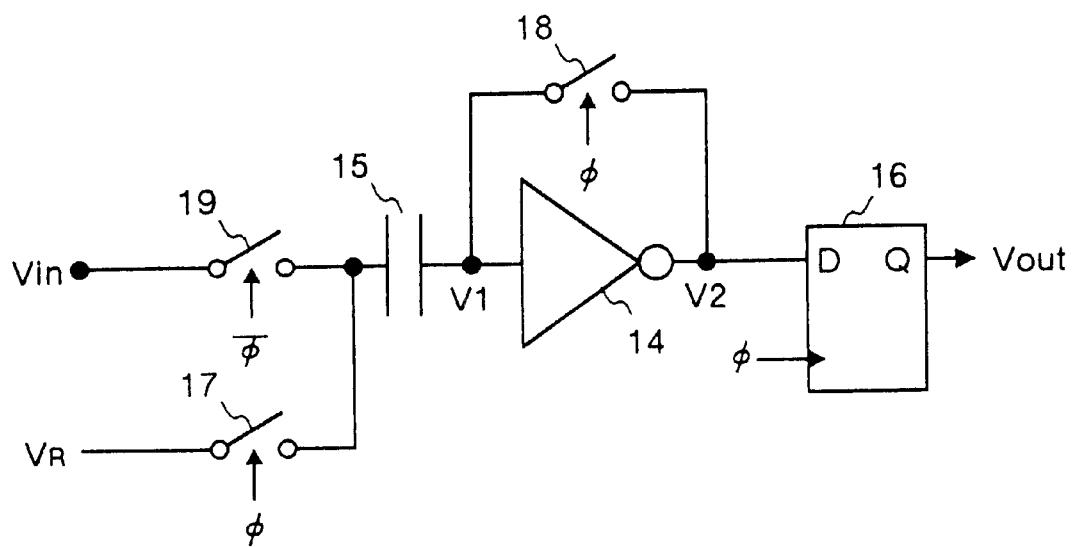
FIG. 7 is a circuit diagram of a conventional chopper comparator.
Figure 8:
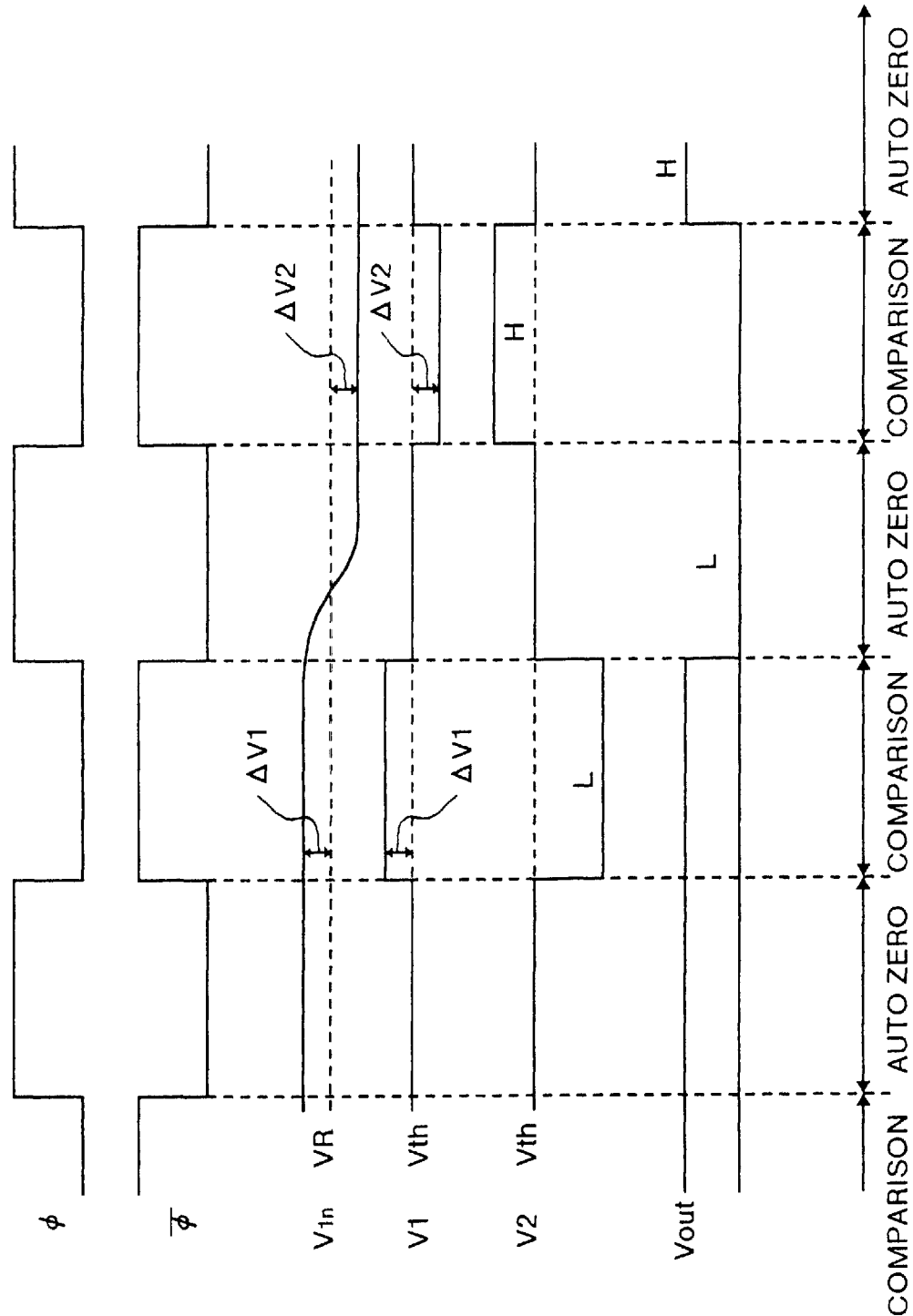
FIG. 8 is an operation timing diagram of the conventional comparator of chopper type.
Figure 9:
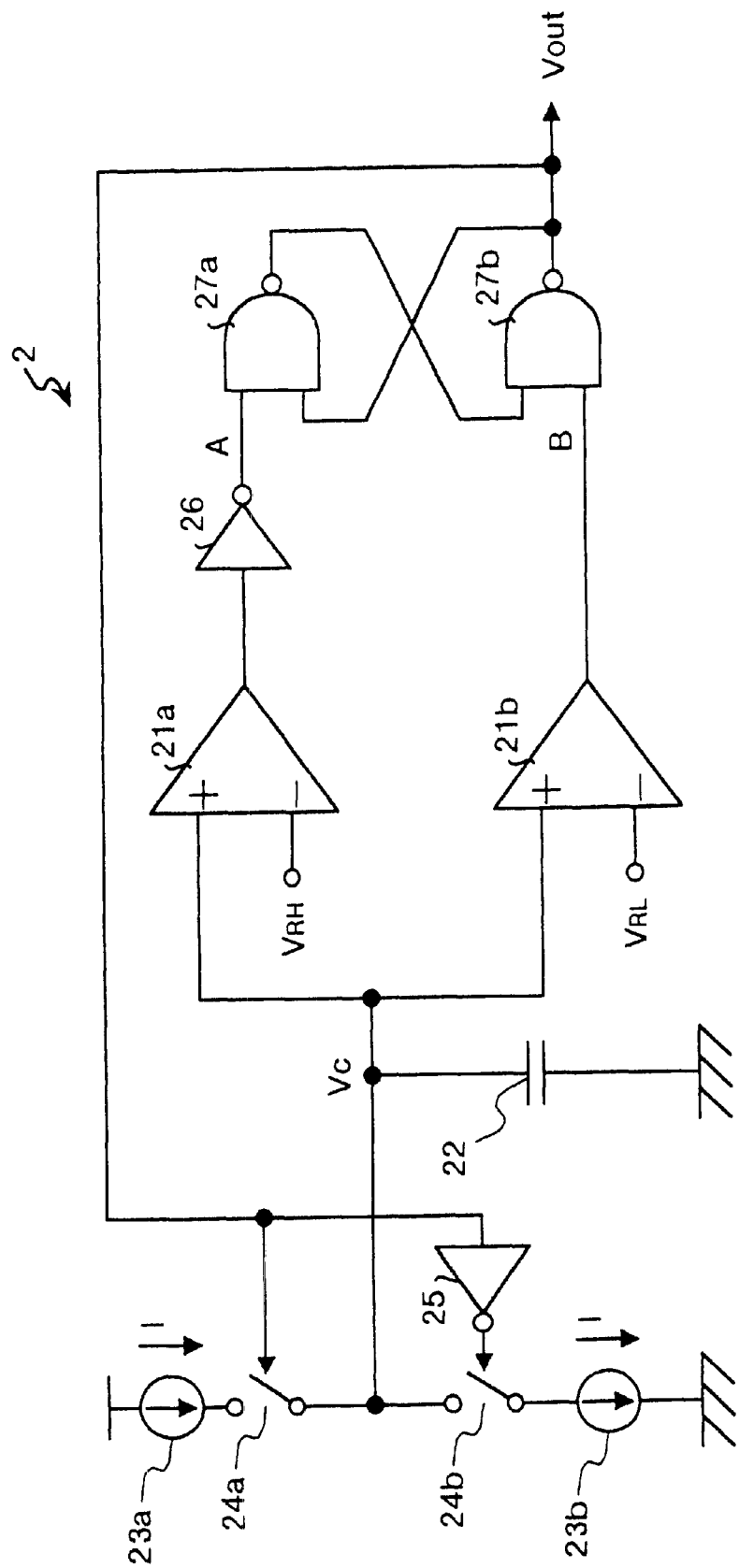
FIG. 9 is a circuit diagram of an oscillator circuit using a comparator;r.
Figure 10:
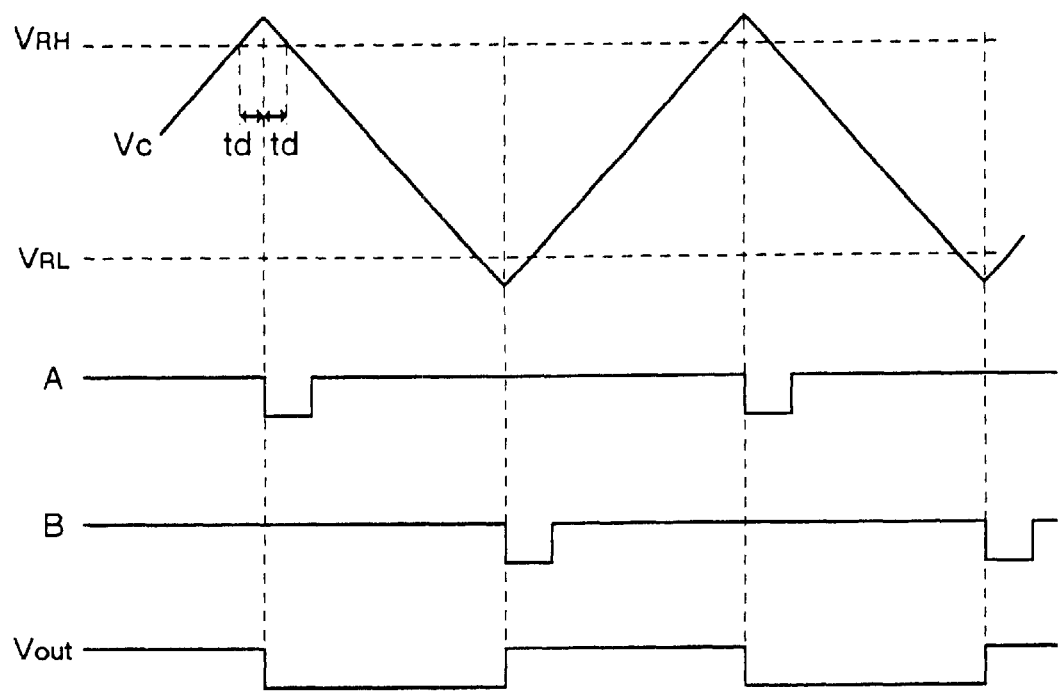
FIG. 10 is an operation timing diagram of t he oscillator circuit using a comparator.
Figure 11:
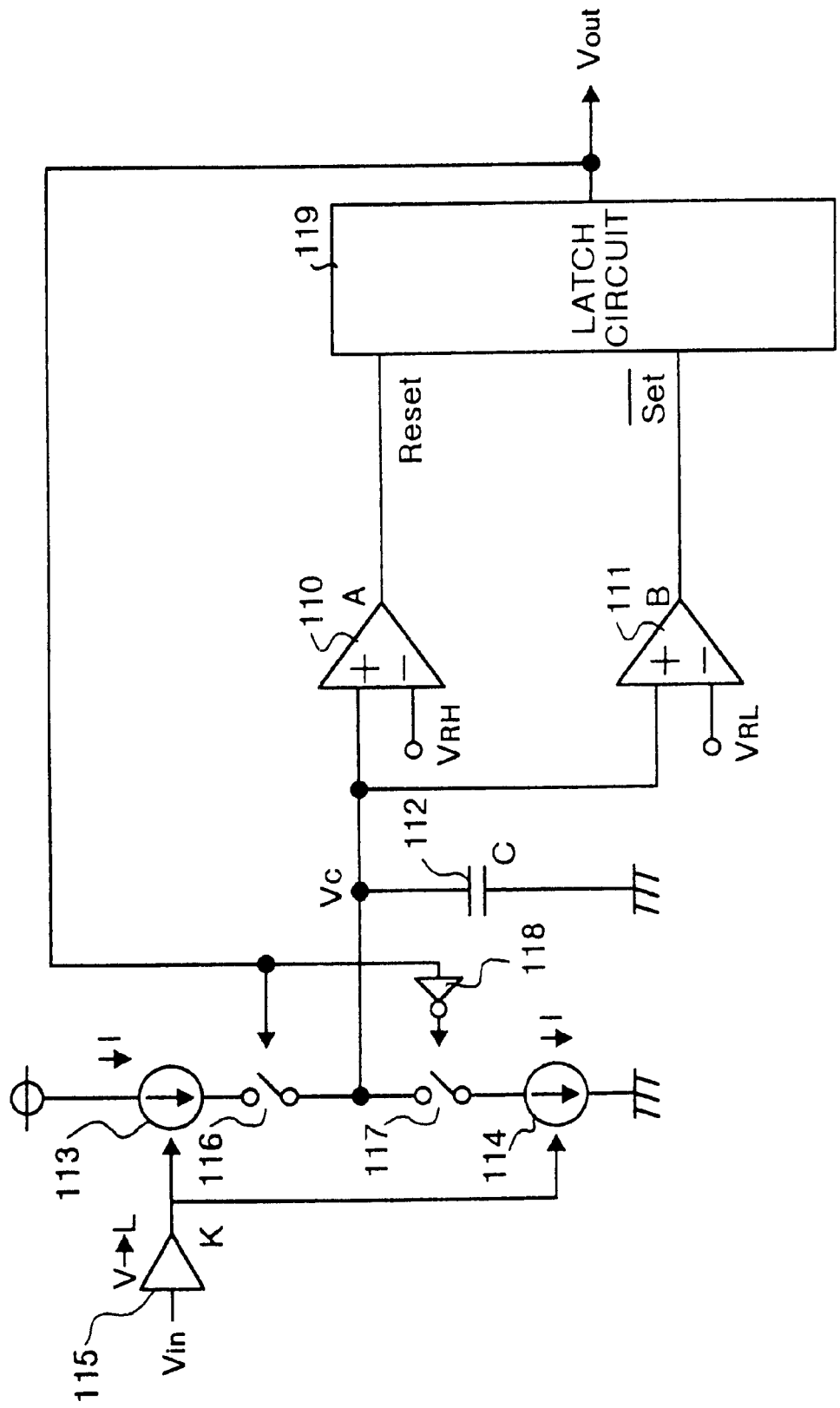
FIG. 11 is a schematic diagram showing the configuration of a conventional voltage controlled oscillator circuit.
Figure 12:
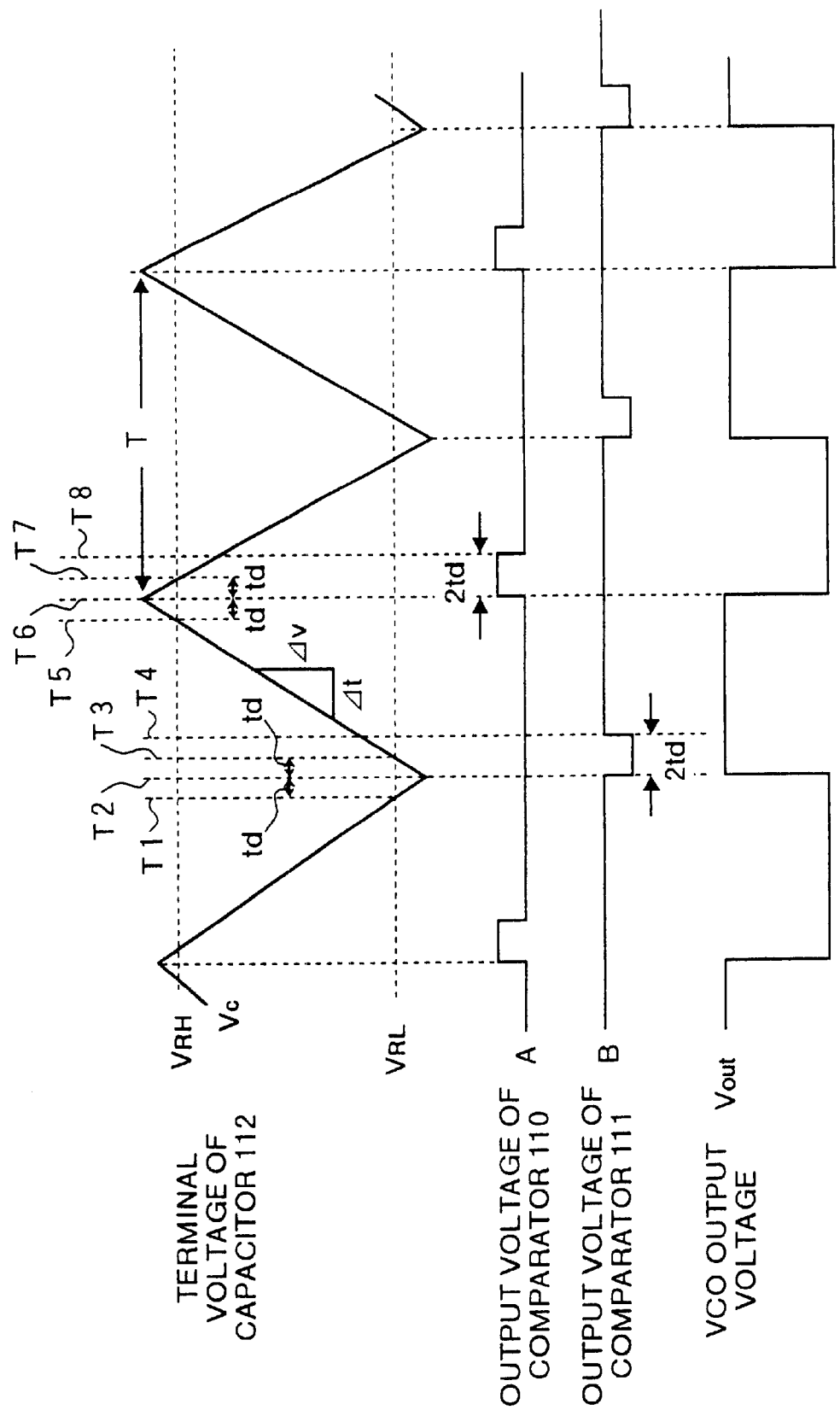
FIG. 12 is a timing chart illustrating the operation of the voltage controlled oscillator circuit shown in FIG. 11.
Figure 13:
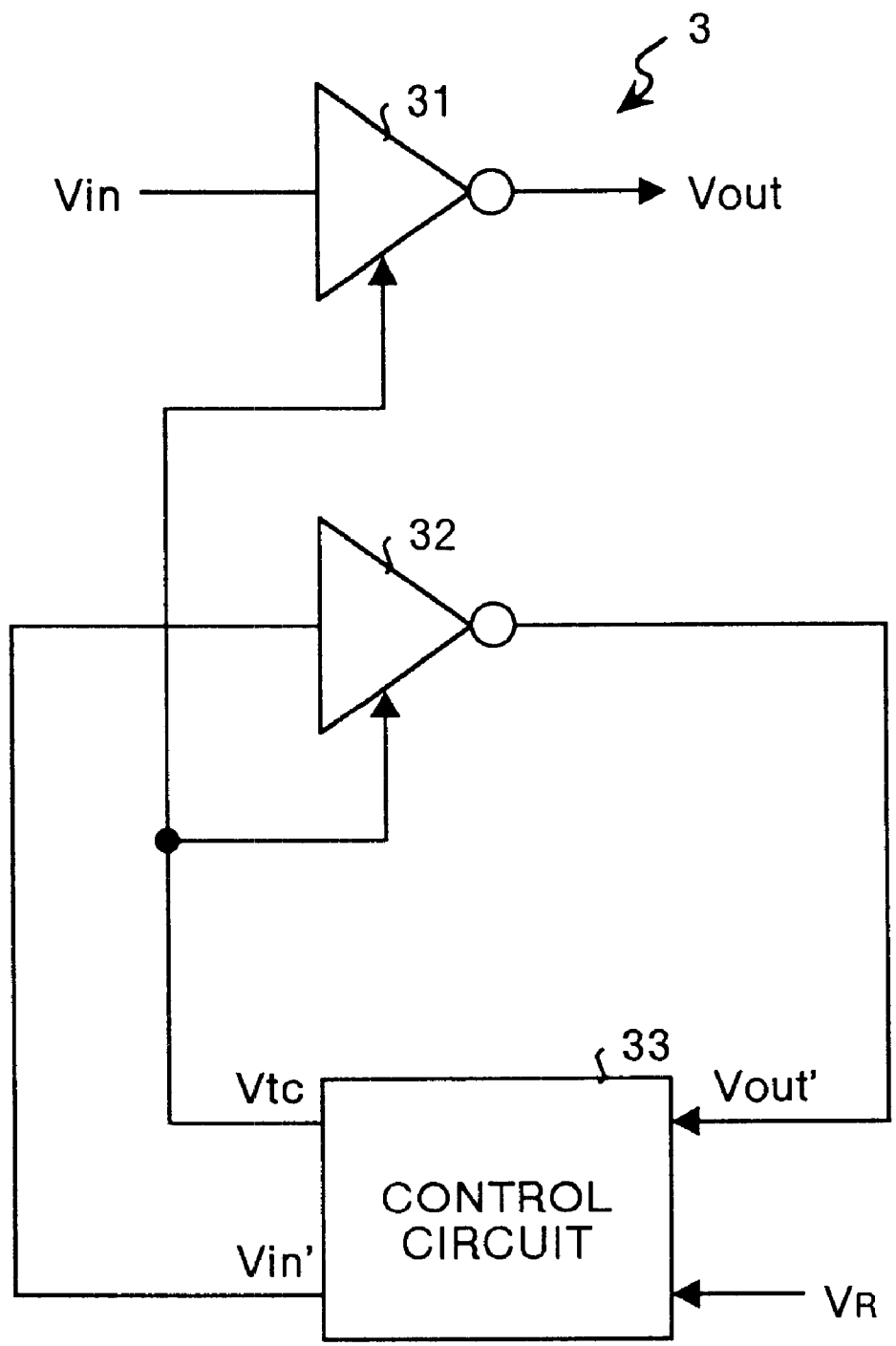
FIG. 13 is a diagram illustrating the principle of a comparator according to the present invention.
Figure 14:
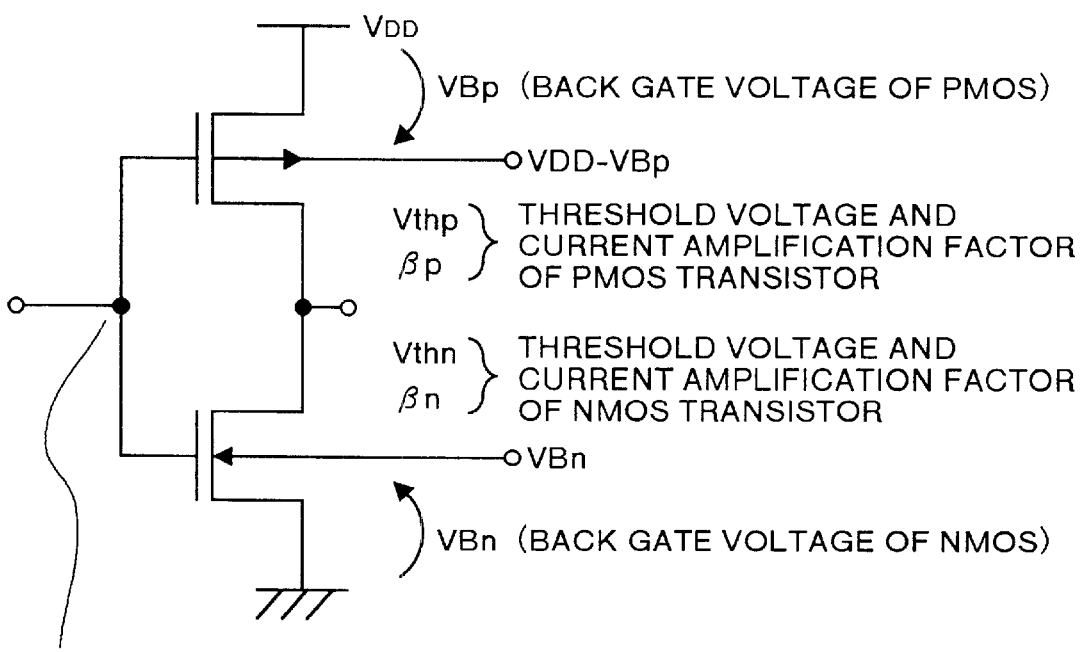
FIG. 14 is a diagram illustrating the control principle of threshold voltage of an inverter forming a comparator according to the present invention.
Figure 15:
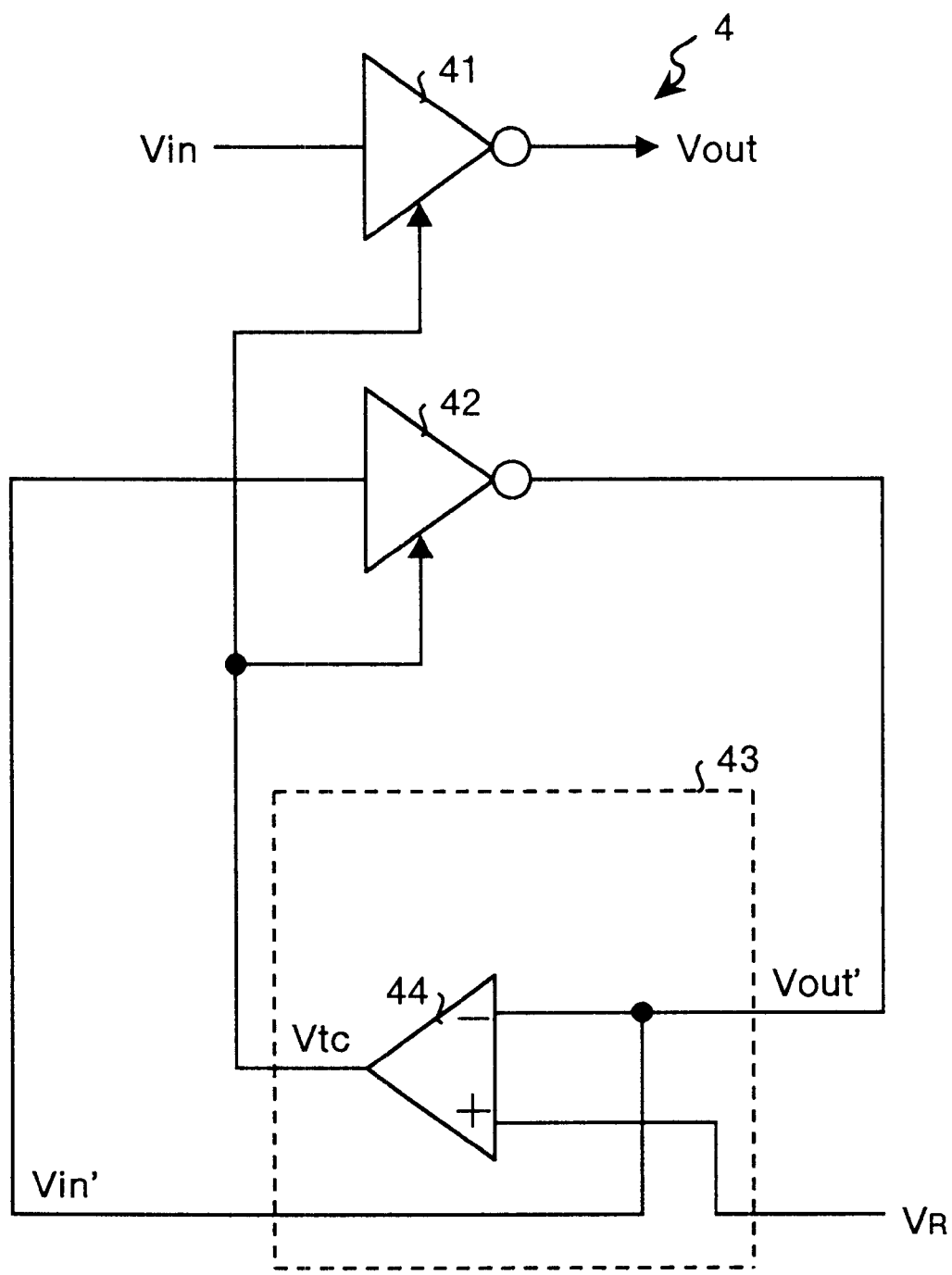
FIG. 15 is a circuit diagram showing the configuration of a first embodiment of a comparator according to the present invention.

FIG. 15 is a circuit diagram showing with circuit symbols the configuration of the first embodiment of the comparator according to the present invention. The comparator 4 of the first embodiment includes an inverter 41 for comparing the input voltage Vin with its threshold voltage Vth and outputting the output voltage Vout, a dummy inverter 42 which can be regarded as having the same electric characteristics as those of the inverter 41 to control the threshold voltage Vth of the inverter 41, and a control circuit 43 for controlling the threshold voltages Vth of the inverter 41 and the dummy inverter 42.

The control circuit 43 includes a differential amplifier circuit 44. The differential amplifier circuit 44 is supplied with an external reference voltage VR at its non-inverting input terminal. On the other hand, a Vth detecting output voltage Vout' which is an output signal of the dummy inverter 42 is input into an inverting input terminal.

The differential amplifier circuit 44 outputs a Vth control voltage Vtc for controlling the threshold voltages Vth of the inverters 41 and 42. The inverter 41 and the dummy inverter 42 have such a configuration that the threshold voltage Vth is controlled by the Vth control voltage Vtc input thereto. Furthermore, the Vth detecting output voltage Vout' is input into input terminals of the inverter 41 and the dummy inverter 42 as Vth detecting input voltage Vin'.

Figure 16:
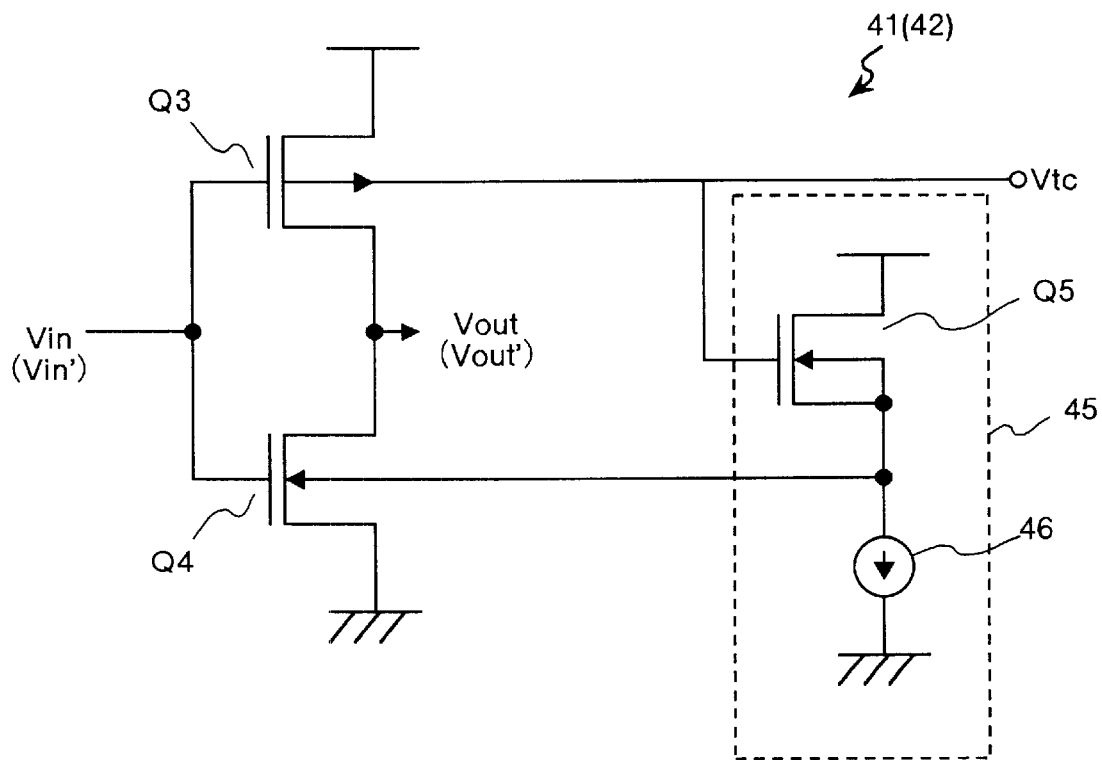
FIG. 16 is a circuit diagram showing the configuration of an inverter in the first embodiment of a comparator according to the present invention.

FIG. 16 is a circuit diagram showing the example of the inverter 41 or the dummy inverter 42. In FIG. 16, reference numerals of the inverter 41 are shown. The reference numerals of the dummy inverter 42 are shown in parentheses. (This holds true for FIGS. 17 through 19 as well.) In the inverter 41 (or dummy inverter 42), the Vth control voltage Vtc output from the differential amplifier circuit 44 of the control circuit 43 is applied to a back gate of a PMOS transistor Q3, and an output voltage of level shifter 45 to which the Vth control voltage Vtc is input is applied to a back gate of NMOS transistor Q4.

The level shifter 45 includes NMOS transistor Q5 serving as a load resistor and current source 46. The Vth control voltage Vtc is input into the gate of the NMOS transistor Q5. The level shifter 45 outputs a source voltage of the NMOS transistor Q5 to the NMOS transistor Q4.

Effects of the first embodiment will now be described. The Vth detecting input voltage Vin' of the dummy inverter 42 is short-circuited to the Vth detecting output voltage Vout', resulting in direct current feedback. As a result, the Vth detecting output voltage Vout' becomes the threshold voltage Vth of the dummy inverter 42.

A difference between the Vth detecting output voltage Vout', i.e., the threshold voltage Vth of the dummy inverter 42 and the reference voltage VR is amplified by the differential amplifier circuit 44. The amplified difference is input into the inverter 41 and the dummy inverter 42 as the Vth control voltage Vtc. As a result, control is effected so as to make the threshold voltages Vth of the inverter 41 and the dummy inverter 42 coincide with the reference voltage VR.

According to the first embodiment, the dummy inverter 42 having the same electric characteristics as those of the inverter 41 functioning as the comparator is provided. The Vth detecting input voltage Vin' of the dummy inverter 42 is short-circuited to the Vth detecting output voltage Vout' to make the Vth detecting output voltage Vout' coincide with the threshold voltage Vth of the dummy inverter 42. Thereby, the threshold voltage Vth of the dummy inverter 42 is detected.

By controlling the back gate voltages of the MOS transistors Q3 and Q4 respectively forming the dummy inverter 42 and the inverter 41 so as to make the threshold voltage Vth coincide with the external reference voltage VR, the threshold voltage Vth of the inverter 41 can be controlled. Thus, by using the inverter 41, a comparator capable of continuously performing fast and accurate comparison is obtained.

Furthermore, the first embodiment has the advantage of having higher sensitivity because the back gate voltages of both the PMOS transistor Q3 and the NMOS transistor Q4 are controlled.

Figure 17:
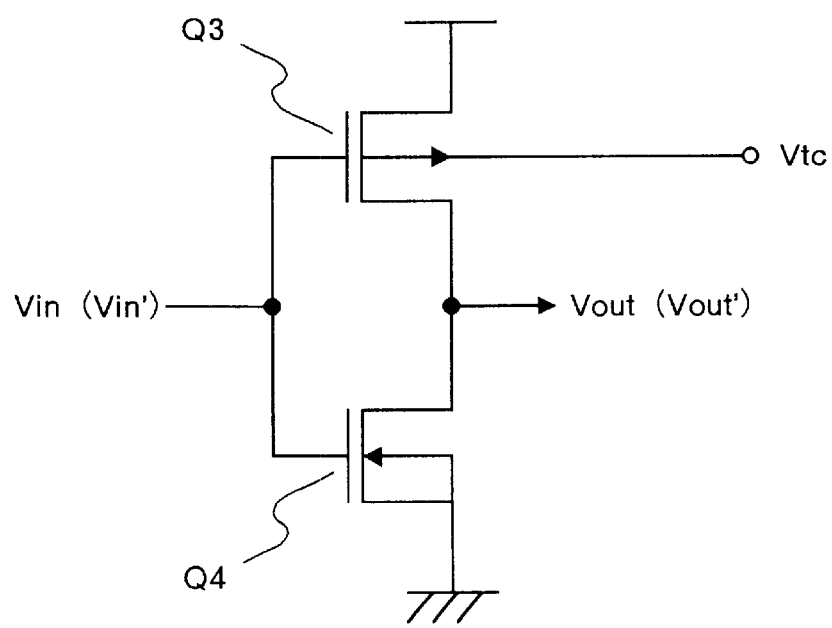
FIG. 17 is a circuit diagram showing another example of the inverter.
Figure 18:
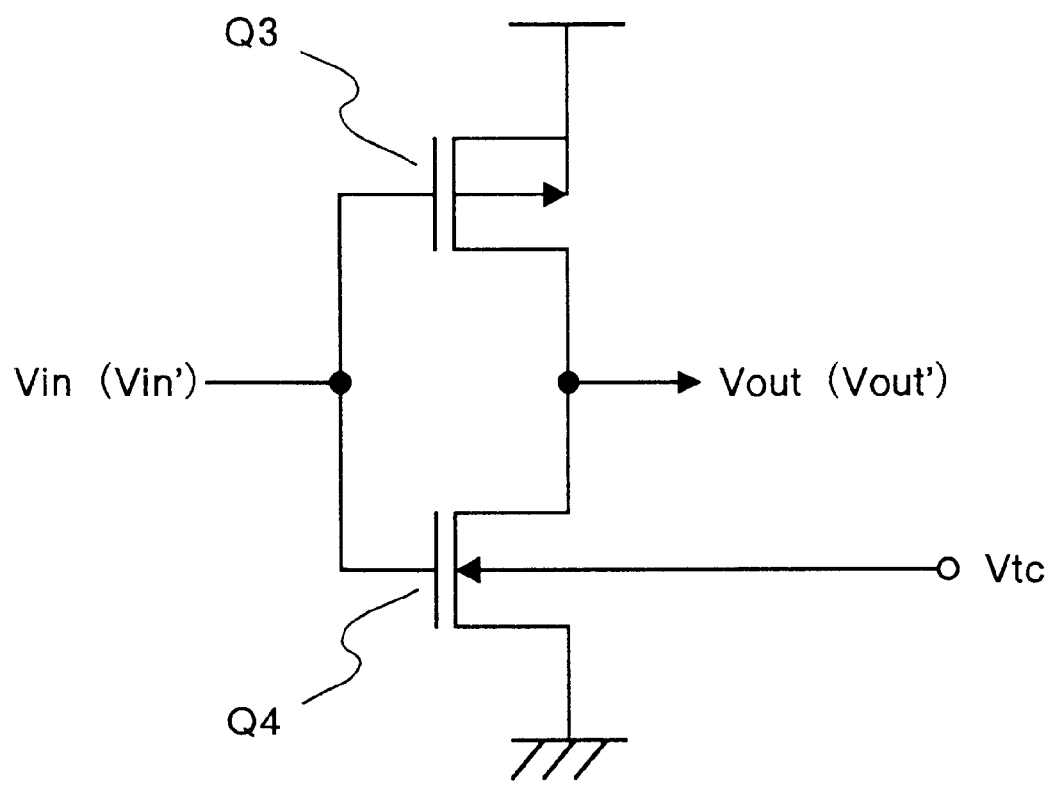
FIG. 18 is a circuit diagram showing another example of the inverter.

In this embodiment, the threshold voltage Vth of the inverter 41 and the dummy inverter 42 are controlled by controlling the back gate voltages of the PMOS transistor Q3 and the NMOS transistor Q4. However, the configuration is not restricted to this. For example, the back gate voltage of only the PMOS transistor Q3 may be controlled as shown in FIG. 17. Or the back gate voltage of only the NMOS transistor Q4 may be controlled as shown in FIG. 18.

By doing so, the level shifter 45 becomes unnecessary. Therefore, there are advantages that the circuit size of the comparator becomes small, and when the back gate voltages of both the PMOS transistor Q3 and the NMOS transistor Q4 cannot be controlled.

Figure 19:
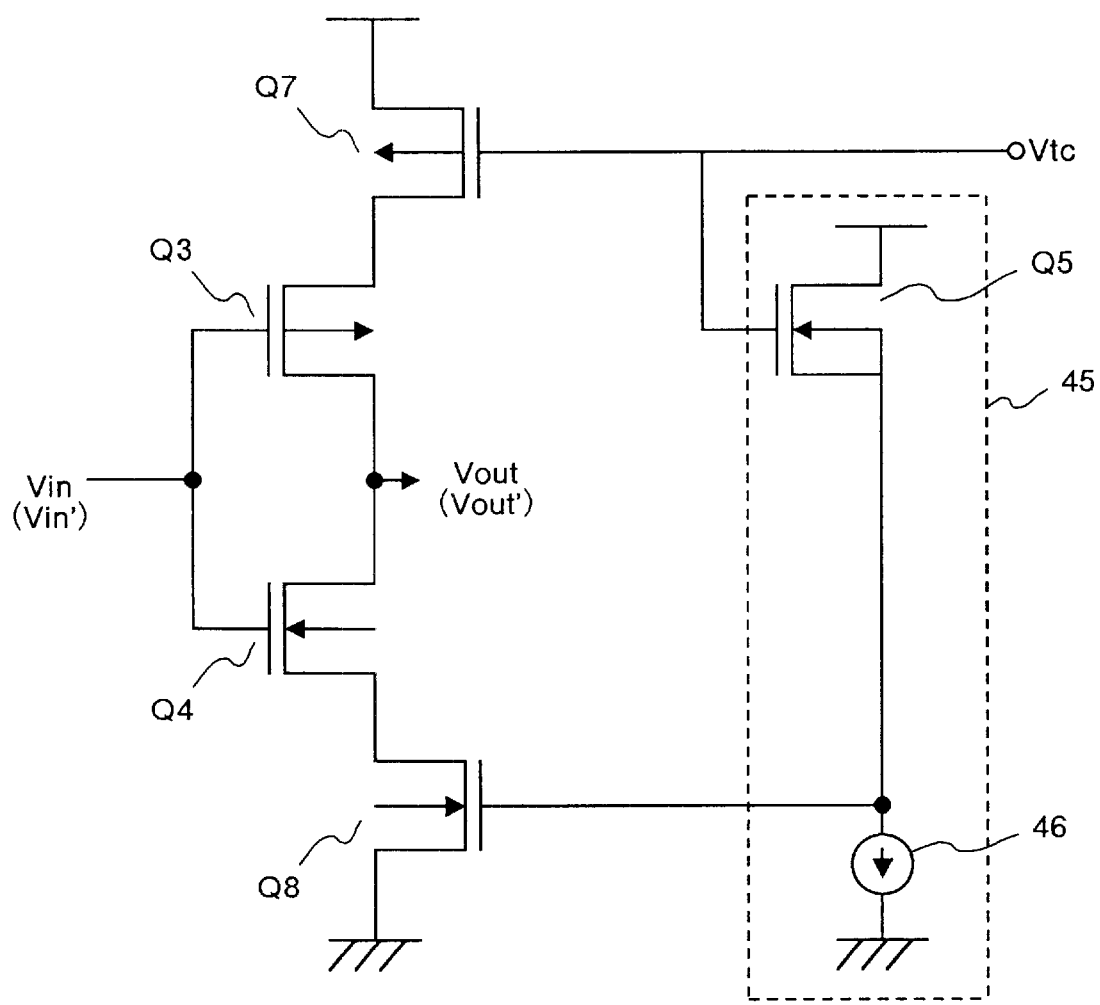
FIG. 19 is a circuit diagram showing another example of the inverter.

Furthermore, it is also possible to connect the PMOS transistor Q7 and the NMOS transistor Q8 respectively in series with the sources of the PMOS transistor Q3 and the NMOS transistor Q4 as shown in FIG. 19, apply the Vth control voltage Vtc to the gate of the PMOS transistor Q7, shift the level of the Vth control voltage Vtc by using the level shifter 45, and apply the shifted voltage to gate of the NMOS transistor Q8.

The threshold voltage Vth of the inverter composed of the PMOS transistor Q3 and the NMOS transistor Q4 may be controlled by controlling the gate voltages of the PMOS transistor Q7 and the NMOS transistor Q8 thus connected in series. By doing so, a highly stable comparator is obtained.

Figure 20:
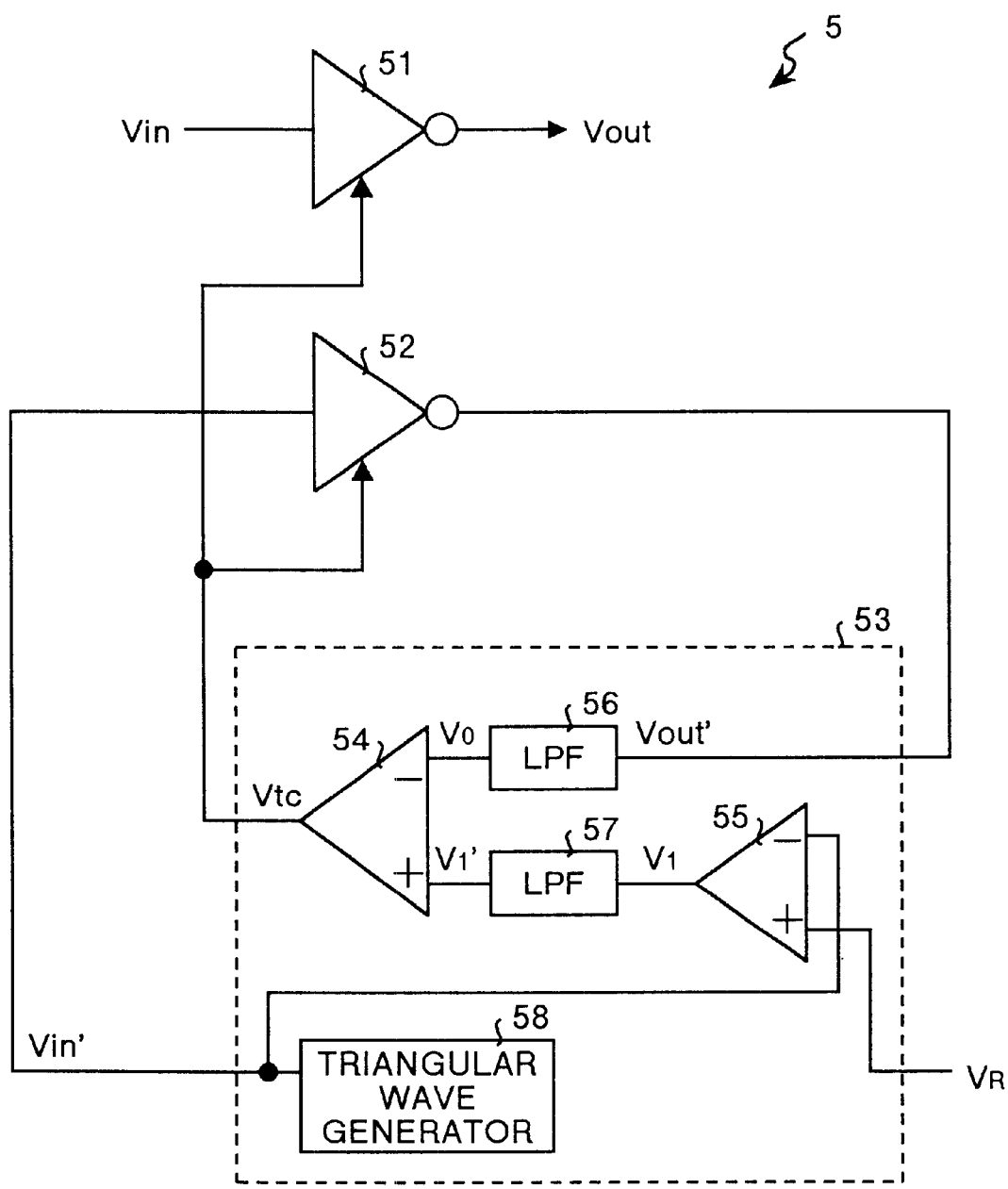
FIG. 20 is a circuit diagram showing the configuration of a second embodiment of a comparator according to the present invention.

FIG. 20 is a circuit diagram showing with circuit symbols the configuration of the second embodiment of the comparator according to the present invention. The comparator 5 of the second embodiment includes inverter 51 for comparing the input voltage Vin with its threshold voltage Vth and outputting the output voltage Vout, dummy inverter 52 which can be regarded as having the same electric characteristics as those of the inverter 51 to control the threshold voltage Vth of the inverter 51, and control circuit 53 for controlling the threshold voltages Vth of the inverter 51 and the dummy inverter 52.

The control circuit 53 includes differential amplifier circuit 54, internal comparator 55 of, for example, differential type, first low-pass filter (LPF) 56, second low-pass filter (LPF) 57, and triangular wave generator circuit 58 which is an alternating current signal generator circuit. The triangular wave generator circuit 58 generates, for example, a triangular wave signal which is an alternating current signal, and outputs it to the input terminal of the dummy inverter 52 as a Vth detecting input voltage Vin'. The dummy inverter 52 outputs a Vth detecting output voltage Vout'. The Vth detecting output voltage Vout' is input into the first low-pass filter 56, where a voltage signal V0 of a direct current component is extracted.

Furthermore, the triangular wave generator circuit 58 outputs the generated triangular signal to the inverting input terminal of the differential comparator 55. The non-inverting input terminal of the differential comparator 55 is supplied with an external reference voltage VR. In other words, the differential comparator 55 compares the triangular wave signal generated by the triangular wave generator circuit 58 with the external reference voltage VR, and outputs a square wave signal V1. The square wave signal V1 output from the differential comparator 55 is input into the second low-pass filter 57, where a voltage signal V1' of a direct current component is extracted.

Two voltage signals V0 and V1' of direct current components respectively output from the first and second low-pass filters 56 and 57 are input into the inverting input terminal and the non-inverting input terminal of the differential amplifier circuit 54, respectively. The differential amplifier circuit 54 amplifies a difference between the voltage signals V0 and V1' of direct current components, and outputs the amplified difference as the Vth control voltage Vtc for controlling the threshold voltages Vth of the inverter 51 and the dummy inverter 52.

The inverter 51 and the dummy inverter 52 have the same configurations as those of the inverter 41 and the dummy inverter 42 of the first embodiment, and to avoid repetition, their description will be omitted.

Figure 21:
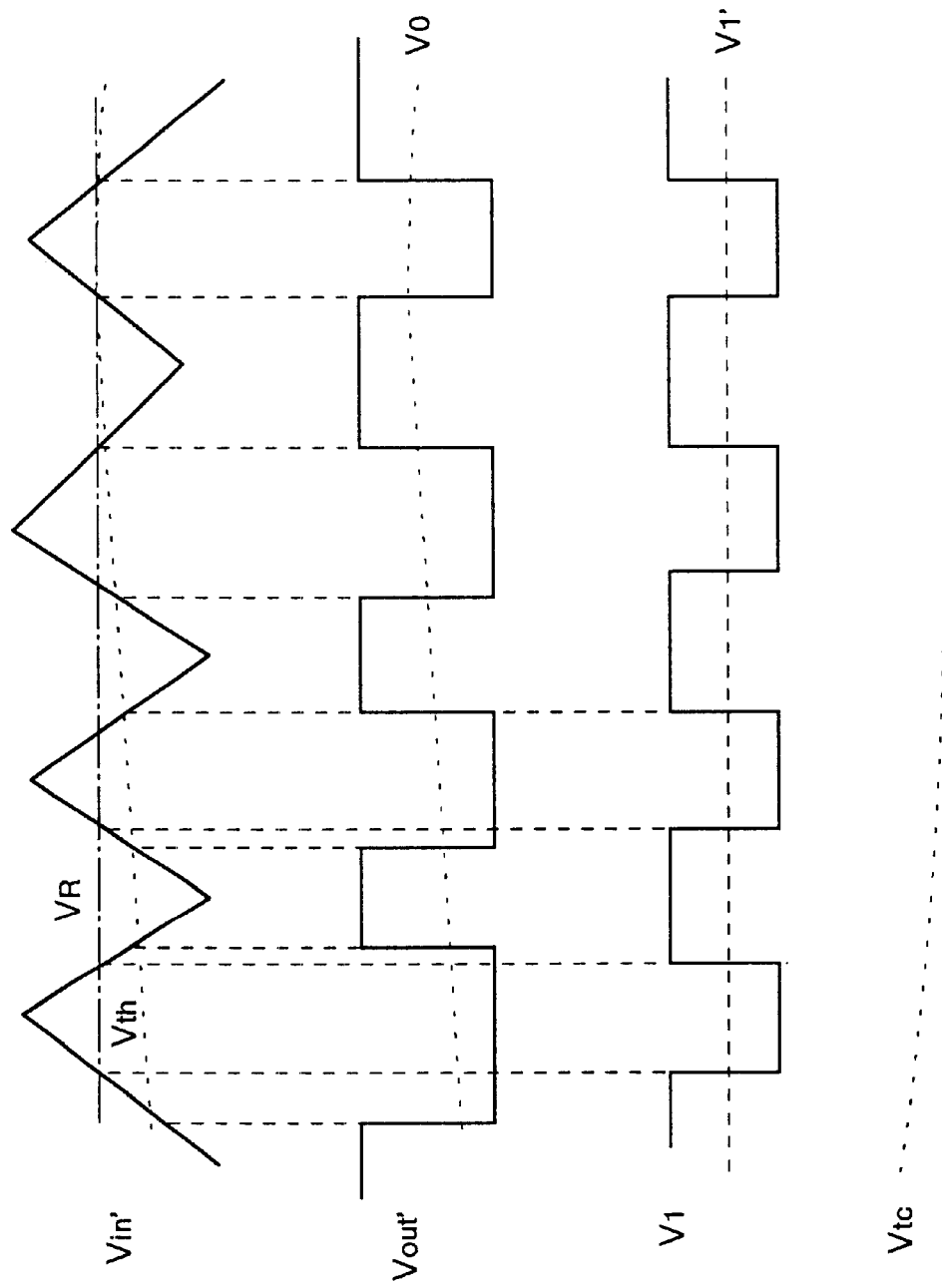
FIG. 21 is an operation timing diagram of the second embodiment of a comparator according to the present invention.
Figure 22:
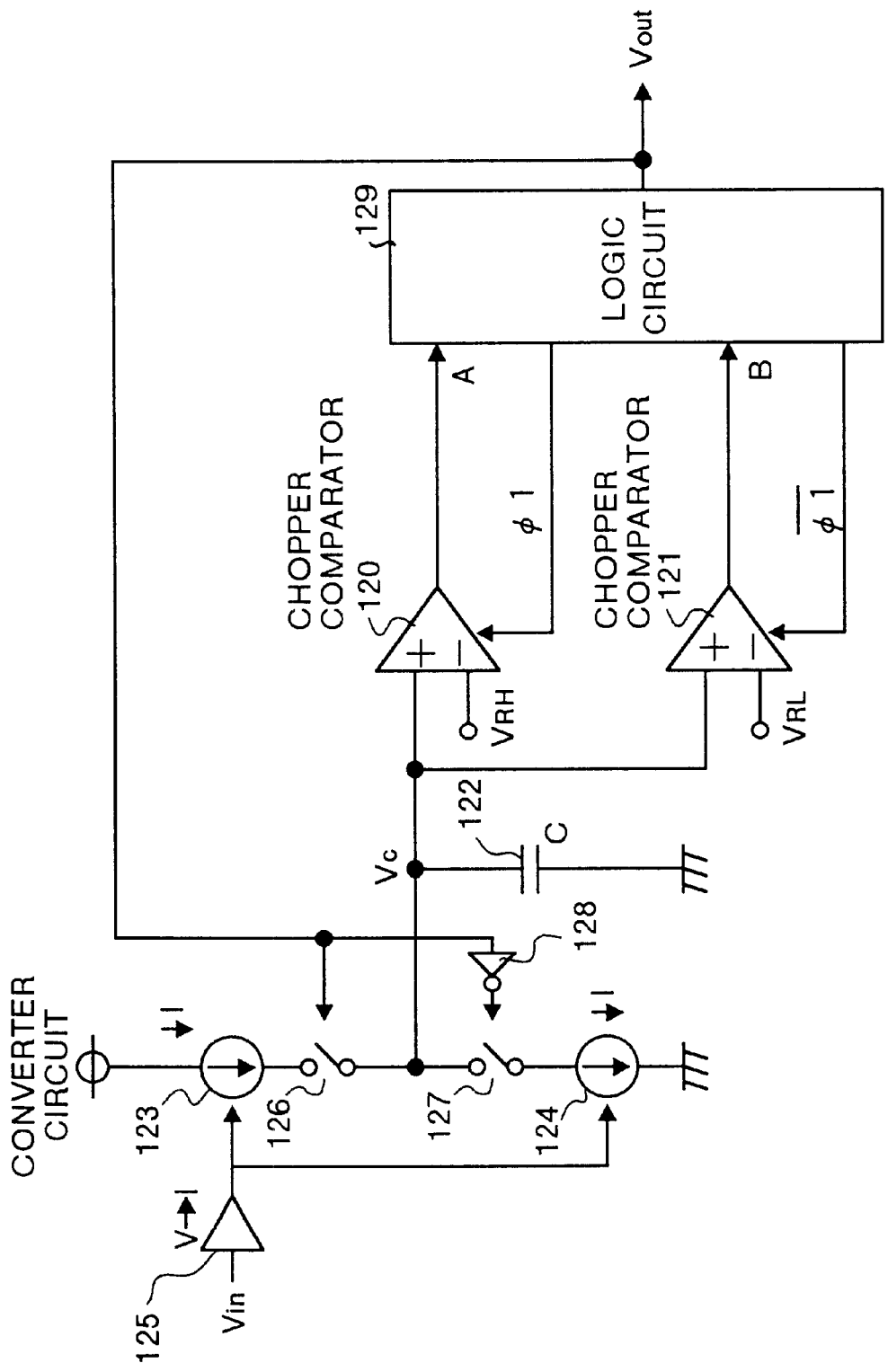
FIG. 22 is a schematic diagram showing a circuit configuration for illustrating the principle of a voltage controlled oscillator circuit according to the present invention.
Figure 23:
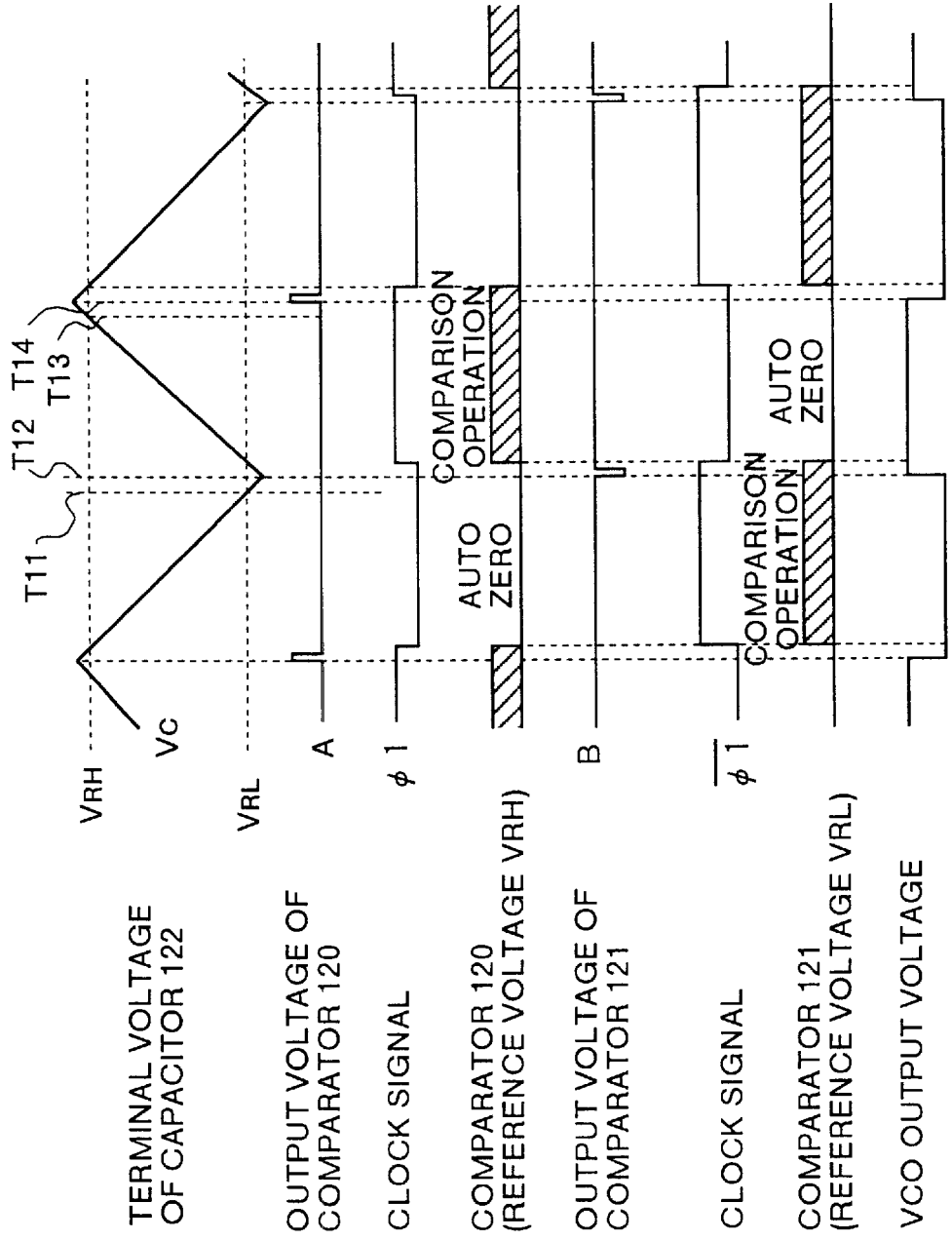
FIG. 23 is a timing chart illustrating the operation of the voltage controlled oscillator circuit shown in FIG. 22.

Effects of the second embodiment will now be described. FIG. 21 is an operation timing diagram of the comparator 5 of the second embodiment. The Vth detecting input voltage Vin' formed of a triangular wave signal output from the triangular wave generator circuit 58 is sliced in the dummy inverter 52 using the threshold voltage Vth. As a result, the Vth detecting output voltage Vout' in the form of a square wave is obtained. A triangular wave signal output from the triangular wave generator circuit 58 is sliced in the comparator 55 included in the control circuit 53 using the external reference voltage VR. As a result, a square wave signal V1 is obtained.

By the low-pass filters 56 and 57, voltage signals V0 and V1' of direct current components are extracted from those two square wave signals, i.e., the Vth detecting output voltage Vout' and the signal V1, respectively. The difference between those voltage signals V0 and V1' is amplified in the differential amplifiercircuit 54. The Vth control voltage Vtc is thus obtained.

By this Vth control voltage Vtc, the threshold voltage Vth of the dummy inverter 52 is controlled and the duty ratio of the Vth detecting output voltage Vout' is changed. When the duty ratio of the Vth detecting output voltage Vout' coincides with the duty ratio of the signal V1, the voltage signal V0 of the direct current component extracted from the Vth detecting output voltage Vout' coincides with the voltage signal V1' of the direct current component extracted from the signal V1. In other words, the difference between the two input signals of the differential amplifier circuit 54 becomes zero.

Therefore, the output signal of the differential amplifier circuit 54, i.e., the Vth control voltage Vtc becomes zero. At this time, the threshold voltage Vth of the dummy inverter 52, i.e., the threshold voltage Vth of the inverter 51 coincides with the external reference voltage VR.

In this second embodiment, the threshold voltage Vth of the inverter 51 can be controlled using the inverter 51. Therefore, a comparator capable of continuously performing fast and accurate comparison is obtained.

In these embodiments, the inverter 41 or 51 functioning as a comparator is provided one in number. However, this is not restrictive, but a plurality of inverters each functioning as an inverter may be provided. In this case, the dummy inverter also may be one or more.

Figure 24:
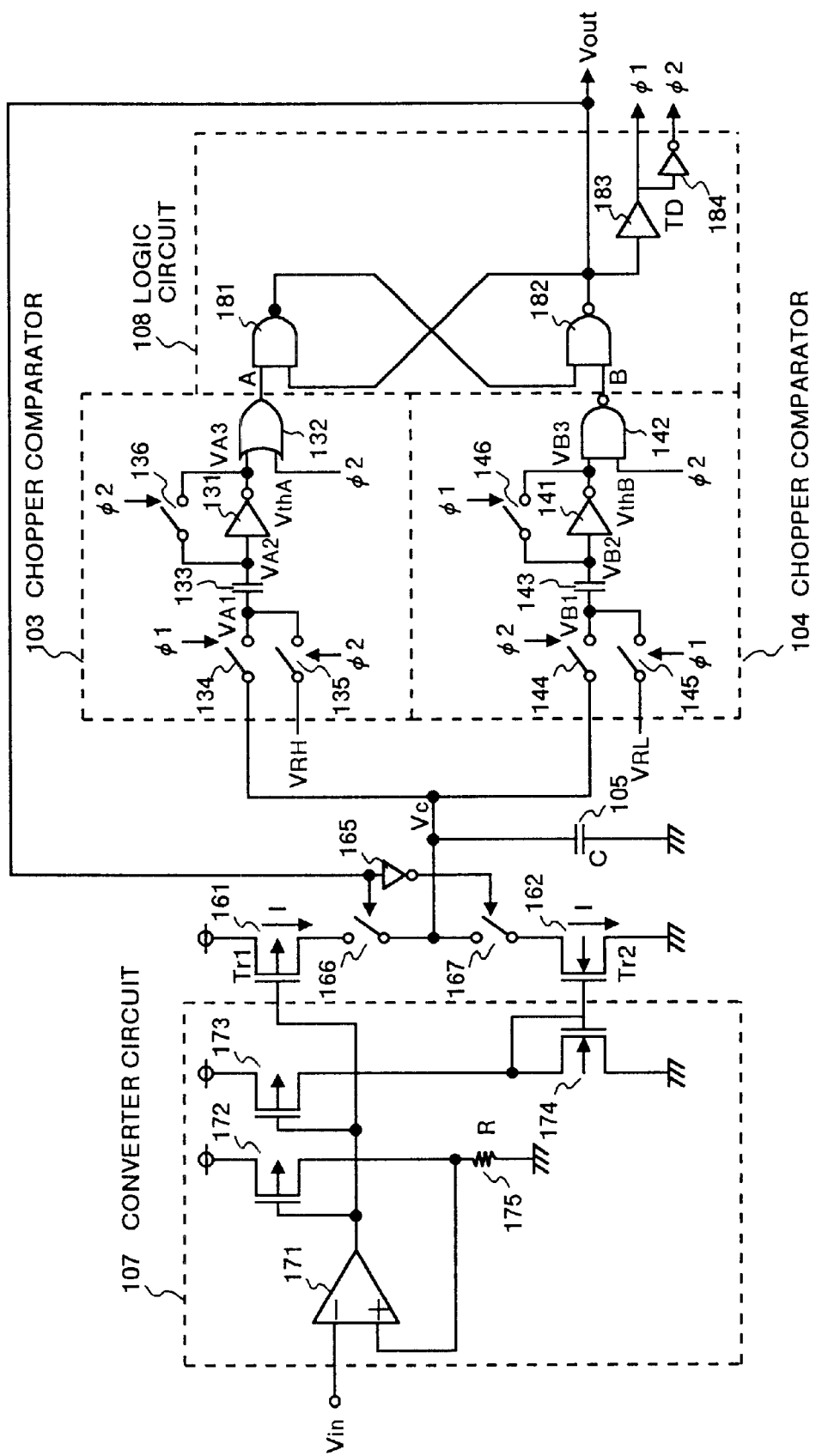
FIG. 24 is a schematic diagram showing the circuit configuration of a third embodiment of a voltage controlled oscillator circuit according to the present invention.
Figure 25:
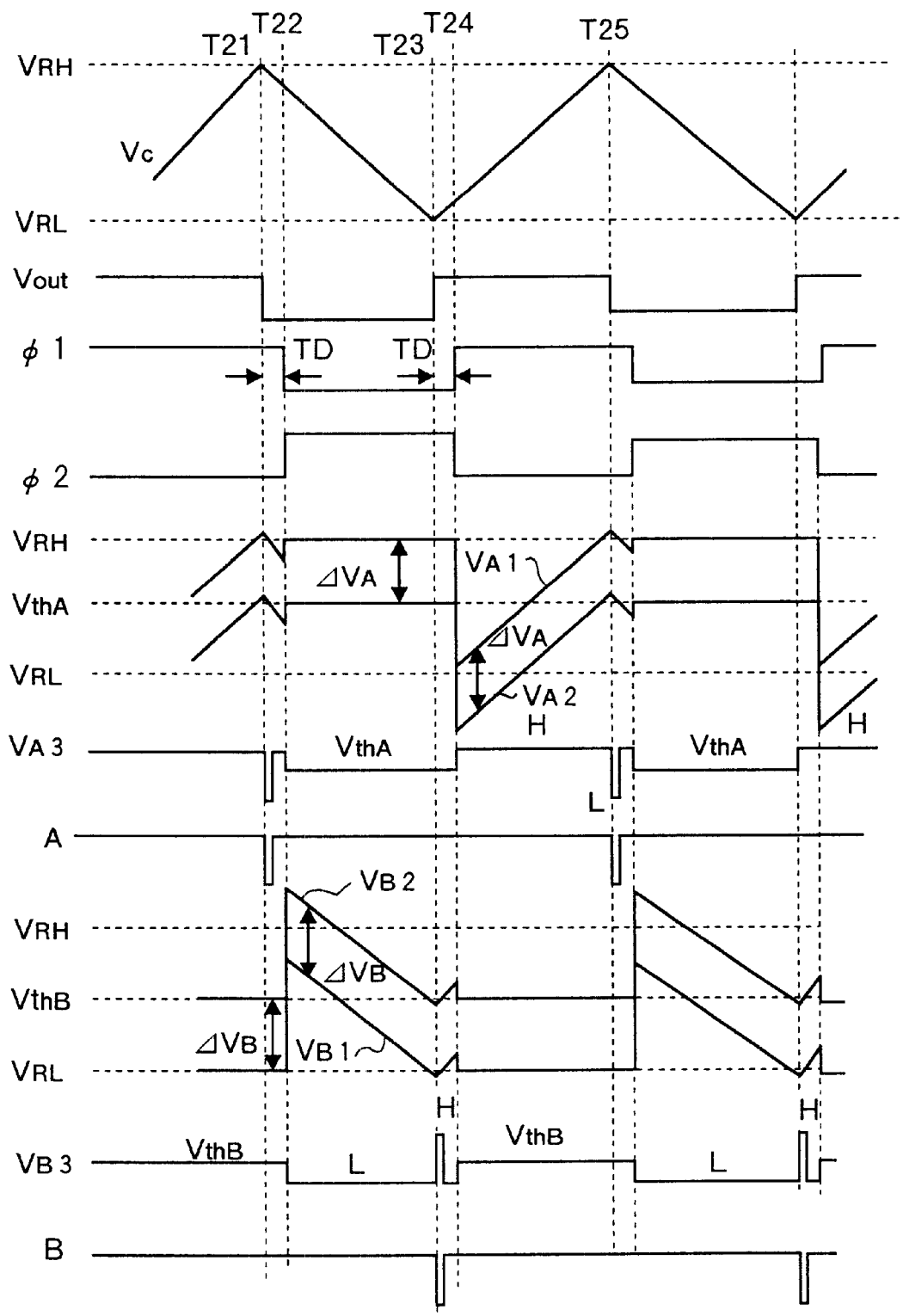
FIG. 25 is a timing chart illustrating the operation of the voltage controlled oscillator circuit shown in FIG. 24.

A third embodiment of the present invention will now be described in detail by referring to FIGS. 24 and 25. FIG. 24 is a schematic diagram showing the third embodiment of a voltage controlled oscillator circuit according to the present invention. FIG. 25 is a timing chart illustrating the operation of this voltage controlled oscillator circuit.

As shown in FIG. 24, this voltage controlled oscillator circuit includes first and second chopper comparators 103 and 104, capacitor 105 for supplying a comparison voltage Vc to first and second comparators 103 and 104, first and second current sources 161 and 162 for charging or discharging the capacitor 105, converter circuit 107 for making the first and second current sources 161 and 162 generate a current I proportionate to the input voltage Vin, first and second switches 166 and 167 and an inverter 165 for controlling on/off of the first and second current sources 161 and 162, and a logic circuit 108 having a function of an output switching circuit for latching output signals of the first and second comparators 103 and 104 and outputting the output voltage Vout serving as the oscillation signal of the voltage controlled oscillator circuit. The logic circuit 108 functions to generate the clock signals Φ1 and Φ2 (where Φ2 is an inversion signal of Φ1) for switching operation of the first and second chopper comparators 103 and 104. Here, the input voltage Vin is a control voltage input from outside in order to control the oscillation frequency of the voltage controlled oscillation circuit.

The converter circuit 107 includes, for example, operational amplifier 171, first and second PMOS transistors 172 and 173, NMOS transistor 174 and, resistor 175. The input voltage Vin is input into the inverting input terminal of the operational amplifier 171. A voltage generated by a resistor 175 (depending upon the resistance of the resistor 175) is input into the non-inverting input terminal of the operational amplifier 171.

One terminal of the resistor 175 is connected to the drain of the first PMOS transistor 172. The other terminal of the resistor 175 is connected to the ground. The source of the first PMOS transistor 172 is connected to a power supply terminal. The gate of the first PMOS transistor 172 is connected to output terminal of the operational amplifier 171.

As for the second PMOS transistor 173, the source is connected to a power supply terminal, the gate is connected to the output terminal of the operational amplifier 171, and the drain terminal is connected to the drain of the NMOS transistor 174. As for the NMOS transistor 174, the source is connected to the ground and the gate is connected to the gate of, for example, a second NMOS transistor Tr2 forming the second current source 162. The gate and the drain of the NMOS transistor 174 are short-circuited. The NMOS transistor 174 and the NMOS transistor Tr2 form a current mirror circuit.

The first current source 161 is formed of, for example, a third PMOS transistor Tr1. As for the PMOS transistor Tr1, the source is connected to a power supply terminal, gate is connected to the output terminal of the operational amplifier 171, and drain terminal is connected to one of the terminals of the first switch 166.

As for the second NMOS transistor Tr2 forming the second current source 162, the source is connected to the ground, the drain is connected to one of the terminals of the second switch 167, and the gate is connected to the gate and drain of the NMOS transistor 174 of the converter circuit 107 as described above.

The first switch 166 is controlled for its on/off switching by the output voltage Vout of the logic circuit 108, i.e., the oscillation signal of the voltage controlled oscillation circuit. The second switch 167 is controlled for its on/off switching by a signal obtained by inverting the output voltage Vout of the logic circuit 108 by means of the inverter 165. As for the first switch 166 and the second switch 167, input signals for on/off control are input at phases shifted from each other by 180 degrees. At all times, therefore, only one of them turns on exclusively.

Although not especially restricted, for example, it is assumed that the first or second switches 166 and 167 becomes on when the on/off switching control signal is "H"

level at which the potential is relatively high, and becomes off when the on/off switching control signal is "L" level at which the potential is relatively low.

Remaining terminals of the first and second switches 166 and 167 are connected in common to one of the terminals of the capacitor 105. The other terminal of the capacitor 105 is grounded. When the first switch 166 is closed, therefore, the second switch 167 is open and the capacitor 105 is charged due to the current of the first current source 161.

On the other hand, when the second switch 167 is closed, the first switch 166 is open and the capacitor 105 is discharged due to the current dragged by the second current source 162.

The first chopper comparator 103 includes, for example, second inverter 131, OR gate 132, second capacitor 133, and third through fifth switches 134, 135 and 136. One of the terminals of the second capacitor 133 is connected to one of the terminals of the third and fourth switches 134 and 135. Remaining terminal of the second capacitor 133 is connected to the input terminal of the second inverter 131.

Remaining terminal of the third switch 134 is connected to the terminal of the capacitor 105 which is not grounded. Remaining terminal of the fourth switch 135 is connected to a terminal to which the high reference voltage VRH is applied.

When the third switch 134 is closed, therefore, the terminal voltage Vc generated by charging or discharging of the capacitor 105 is applied to the second capacitor 133. On the other hand, when the fourth switch 135 is closed, the high reference voltage VRH is applied to the second capacitor 133.

The third switch 134 is controlled for its on/off by the clock signal Φ1 output from the logic circuit 108. On the other hand, the fourth switch 135 is controlled for its on/off by the clock signal Φ2 output also from the logic circuit 108.

Although not especially restricted, for example, it is assumed that the third switch 134 becomes on when the clock signal Φ1 is "H" level and becomes off when the clock signal Φ1 is "L" level. On the other hand, the fourth switch 135 becomes on when the clock signal Φ2 is "H" level and becomes off when the clock signal Φ2 is "L" level.

The output terminal of the second inverter 131 is connected to one of the input terminals of the OR gate 132. Between the input terminal and the output terminal of the second inverter 131, the fifth switch 136 is connected. In other words, the second inverter 131 and the fifth switch 136 are connected in parallel.

The fifth switch 136 is controlled for its on/off by the clock signal Φ2. Although not especially restricted, for example, it is assumed that the fifth switch 136 becomes on when the clock signal Φ2 is "H" level and becomes off when the clock signal Φ2 is "L" level.

When the clock signal Φ1 is "H" level (i.e., when the lock signal (Φ2 is "L" level), therefore, the terminal voltage Vc of the capacitor 105 is input into the first chopper comparator 103 as the comparison voltage. The first chopper comparator 103 performs comparison operation on the comparison voltage on the basis of a threshold voltage VthA of the second inverter 131.

On the other hand, when the clock signal Φ2 is "H" level (i.e., when the clock signal Φ1 is "L" level), therefore, the high reference voltage VRH is input into the first chopper comparator 103, and the terminal voltage Vc of the capacitor 105 is not input. In this state, therefore, the first chopper comparator 103 does not perform the comparison operation, but assumes the auto zero state. The threshold voltage VthA of the second inverter 131 is applied to the one of the input terminals of the OR gate 132 and the clock signal Φ2 is input into the other input terminal.

The second chopper comparator 104 includes, for example, third inverter 141, NAND gate 142, third capacitor 143, and sixth through eighth switches 144, 145 and 146. One of the terminals of the third capacitor 143 is connected to one of the terminals of the sixth and seventh switches 144 and 145. Remaining terminal of the third capacitor 143 is connected to input terminal of the third inverter 141. Remaining terminal of the sixth switch 144 is connected to one of the terminals of the capacitor 105 which is not grounded. Remaining terminal of the seventh switch 145 is connected to a terminal to which the low reference voltage VRL is applied.

When the sixth switch 144 is closed, therefore, the terminal voltage Vc of the capacitor 105 is applied to the third capacitor 143. On the other hand, when the seventh switch 145 is closed, the low reference voltage VRL is applied to the third capacitor 143. The sixth switch 144 is controlled for its on/off by the clock signal Φ2. On the other hand, the seventh switch 145 is controlled for its on/off by the clock signal Φ1.

Although not especially restricted, for example, it is assumed that the sixth switch 144 becomes on when the clock signal Φ2 is "H" level and becomes off when the clock signal (Φ2 is "L" level. On the other hand, the seventh switch 145 becomes on when the clock signal Φ1 is "H" level, and off when the clock signal Φ1 is "L" level.

The output terminal of the third inverter 141 is connected to one of the input terminals of the NAND gate 142. Between the input terminal and the output terminal of the third inverter 141, the eighth switch 146 is connected. In other words, the third inverter 141 and the eighth switch 146 are connected in parallel.

The eighth switch 146 is controlled for its on/off by the clock signal Φ1. Although not especially restricted, for example, it is assumed that the eighth switch 146 becomes on hen the clock signal Φ1 is "H" level and becomes off when the lock signal Φ1 is "L" level.

When the clock signal Φ2 is "H" level (i.e., when the clock signal Φ1 is "L" level), therefore, the terminal voltage Vc of the capacitor 105 is input into the second chopper comparator 104 as the comparison voltage. The second chopper comparator 104 performs comparison operation on the comparison voltage on the basis of a threshold voltage VthB of the third inverter 141.

On the other hand, when the clock signal Φ1 is "H" level (i.e., when the clock signal Φ2 is "L" level), therefore, the low reference voltage VRL is input into the second chopper comparator 104, and the terminal voltage Vc of the capacitor 105 is not input. In this state, therefore, the second chopper comparator 104 does not perform the comparison operation, but assumes the auto zero state. The threshold voltage VthB of the third inverter 141 is applied to one of the input terminals of the NAND gate 142 and the clock signal Φ2 is input into the remaining input terminal of the NAND gate 142.

The logic circuit 8 includes second and third NAND gates 181 and 182, delay circuit 183, and fourth inverter 184. The second and third NAND gates 181 and 182 form a latch circuit for latching the output signal of the OR gate 132 of the first chopper comparator 103 and the output signal of the NAND gate 142 of the second chopper comparator 104.

One of the input terminals of the second NAND gate 181 is connected to the output terminal of the OR gate 132 of the first chopper comparator 103. Remaining input terminal of the second NAND gate 181 is connected to the output terminal of the third NAND gate 182. On the other hand, one of the input terminals of the third NAND gate 182 is connected to the output terminal of the NAND gate 142 of the second chopper comparator 104. Remaining input terminal of the third NAND gate 182 is connected to the output terminal of the second NAND gate 181.

The third NAND gate 182 outputs the output voltage Vout serving as the oscillation signal of the voltage controlled oscillator circuit to the outside. The third NAND gate 182 also outputs the output voltage Vout to the first and second switches 166 and 167 and to the delay circuit 183 as well. The delay circuit 183 delays the output voltage Vout by a predetermined time (where the delay time is TD), and outputs the delayed Vout as a clock signal Φ1.

The clock signal Φ1 is inverted by the fourth inverter 184, and output as a clock signal Φ2. Therefore, the second and third NAND gates (latch circuit), the delay circuit 183, and the fourth inverter 184 have a function of a clock signal generator circuit.

Operation of the voltage controlled oscillator circuit having the above described configuration will now be described by referring to FIG. 25. In the first chopper comparator 103, voltage changes at a node between one of the terminals of the capacitor 133 and the switches 134 and 135, node between the remaining terminal of the capacitor 133 and the input terminal of the inverter 131, and a node between the output terminal of the inverter 131 and the input terminal of the OR gate 132 are shown in FIG. 25 as VA1, VA2 and VA3, respectively. Further, output voltage change of the OR gate 132 is shown as a voltage change of a node A shown in FIG. 24.

In the second chopper comparator 104, voltage changes at a node between one of the terminals of the capacitor 143 and the switches 144 and 145, a node between the remaining terminal of the capacitor 143 and the input terminal of the inverter 141, and a node between the output terminal of the inverter 141 and the input terminal of the NAND gate 142 are shown in FIG. 25 as VB1, VB2 and VB3, respectively. Further, output voltage change of the NAND gate 142 is shown as a voltage change of a node B shown in FIG. 24.

If the delay time TD of the delay circuit 183 has elapsed (at time T22) since switching of the output voltage Vout from "H" level to "L" level (at time T21), then the clock signal Φ1 switches from "H" level to "L" level. Further, the clock signal Φ2 switches from "L" level to "H" level. The second chopper comparator 104 assumes the state for performing the comparison operation. On the other hand, the first chopper comparator 103 assumes the auto zero state. In the auto zero state, the first chopper comparator 103 stores a potential difference ΔVA between the threshold voltage VthA of the inverter 131 in the comparator 103 and the high reference voltage VRH across the capacitor 133 in preparation for the next comparison operation. On the other hand, in the second chopper comparator 104, a voltage VB1 at one of the terminals of the capacitor 143 connected to the capacitor 105 side becomes Vc.

Furthermore, in the second chopper comparator 104, a potential difference ΔVB between the threshold voltage VthB of the inverter 141 in the comparator 104 and the low reference voltage VRL has been stored across the capacitor 143 in the immediately preceding auto zero state. At time T22, therefore, a voltage VB2 at the remaining terminal of the capacitor 143 connected to the inverter 141 side becomes Vc+ΔVB.

As the terminal voltage Vc of the capacitor 105 is lowered by discharging of the capacitor 105, VB1 and VB2 also fall. Thus, when Vc reaches the low reference voltage VRL, i.e., when Vc=VRL is satisfied, the voltage VB2 becomes equal to the threshold voltage VthB of the inverter 141 as represented by the following equation (9).

$$VB2=Vc+\Delta VB=Vc+(VthB-VRL)=VthB \quad (9)$$

The inverter 141 is inverted in logic after a slight operation delay (at time T23). The output (VB3) of the inverter 141 switches from "L" level to "H" level. As a result, the output of the comparator 104, i.e., the voltage level at the node B is inverted. Since the latch circuit is thus set, the logic of the output voltage Vout output from the latch circuit is also inverted from "L" level to "H" level.

Upon switching of the output voltage Vout from "L" level to "H" level at the time T23, the clock signal Φ1 switches from "L" level to "H" level when the delay time TD of the delay circuit 183 has elapsed (at time T24) since the time T23. At this time, the clock signal Φ2 switches from "H" level to "L" level. The second chopper comparator 104 is thus switched to the auto zero state. On the contrary, the first chopper comparator 103 assumes the comparison operation state.

In the auto zero state, the second chopper comparator 104 stores a potential difference ΔVB between the threshold voltage VthB of the inverter 141 in the comparator 104 and the low reference voltage VRL across the capacitor 143 in preparation for the next comparison operation. On the other hand, in the first chopper comparator 103, a voltage VA1 at the terminal of the capacitor 133 connected to the capacitor 105 side becomes Vc.

Furthermore, in the first chopper comparator 103, a potential difference ΔVA between the threshold voltage VthA of the inverter 131 in the comparator 103 and the high reference voltage VRH has been stored across the capacitor 133 in the immediately preceding auto zero state. At time T24, therefore, a voltage VA2 at the other terminal of the capacitor 133 connected to the inverter 131 side becomes Vc+ΔVA.

As the terminal voltage Vc of the capacitor 105 is raised by charging of the capacitor 105, VA1 and VA2 also rise. This, when Vc reaches the high reference voltage VRH, i.e., when Vc=VRH is satisfied, the voltage VA2 becomes equal to the threshold voltage VthA of the inverter 131 as represented by the following equation (10).

$$VA2=Vc+\Delta VA=Vc+(VthA-VRH)=VthA \quad (10)$$

The inverter 131 is inverted in logic after a slight operation delay (at time T25). The output (VA3) of the inverter 131 switches from "H" level to "L" level. As a result, the output of the comparator 103, i.e., the voltage level at the node A is inverted. Since the latch circuit is thus reset, the logic of the output voltage Vout output from the latch circuit is also inverted from "H" level to "L" level. The voltage controlled oscillation circuit shown in FIG. 24 repeats the above described operation.

As heretofore described in detail, the third embodiment uses the first and second chopper comparators 103 and 104. The delay time of a typical chopper comparator is approximately one tenth the delay time of a conventional differential comparator, i.e., approximately a few ns. Therefore, the voltage controlled oscillator circuit can be operated at higher speed. Thus, a voltage controlled oscillator capable of operating faster than the conventional voltage controlled oscillator is obtained.

For example, assuming that the delay time of the first and second chopper comparators 103 and 104 is 5 ns, which is one tenth the delay time (50 ns) of a typical differential comparator, in calculation, therefore, the upper limit of the oscillation frequency of the voltage controlled oscillator circuit according to the present embodiment becomes approximately 200 MHz. In the actual circuit design, therefore, the oscillation frequency can be set up to approximately 100 MHz. Thus, as compared with the conventional technique, the upper limit of the oscillation frequency can be increased by approximately ten times.

Furthermore, in the above described third embodiment, the clock signals Φ1 and Φ2 for switching the operation states, i.e., the comparison operation state and the auto zero state of the first and second chopper comparators 103 and 104 are generated on the basis of the oscillation signal of the voltage controlled oscillator circuit. Therefore, operation of the comparators 103 and 104 is switched at high precision. As a result, a voltage controlled oscillator circuit which oscillates at high precision and high frequency is obtained. In the foregoing description, the present invention is not limited to the above described embodiments, but various design changes are possible.

In the present invention, inverter is used as the comparator, and threshold voltage of the inverter is controlled by the control circuit. As a result, a comparator capable of performing faster, more accurate and continuous comparison operation is obtained.

Furthermore, according to the present invention, the comparison voltage based upon the control voltage for controlling the oscillation frequency of the voltage controlled oscillator circuit is compared with the reference voltage by using a faster chopper comparator. As a result, a faster voltage controlled oscillator circuit is obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A comparator comprising:
    an inverter which compares a voltage input from outside with a threshold voltage and outputs the result of the comparison as an output voltage;
    a dummy inverter having a threshold voltage which is equal to or substantially equal to the threshold voltage of said inverter; and
    a control circuit which detects the threshold voltage of said dummy inverter and based upon the result of this detection controls the threshold voltages of said inverter and said dummy inverter;
    wherein said control circuit comprises:
        an alternating current signal generator circuit which generates an alternating current signal and out puts the alternating current signal to said dummy inverter;
        an internal comparator which compares the alternating current signal generated by said alternating current signal generator circuit with an external reference voltage; and
        a differential amplifier circuit which outputs a difference between a direct current component of the output voltage of said internal comparator and a direct current component of the output voltage of said dummy inverter as a control signal for controlling the threshold voltages of said inverter and said dummy inverter.

2. A voltage controlled oscillator circuit comprising:
    a first chopper comparator supplied with a reference voltage having a relatively high potential level, which first chopper comparator assuming a comparison operation state in response to a rise of a comparison voltage depending upon the input voltage and assuming an auto zero state in response to a fall of the comparison voltage;
    a second chopper comparator supplied with a reference voltage having a relatively low potential level, which second chopper comparator assuming an auto zero state in response to a rise of the comparison voltage and assuming a comparison operation state in response to a fall of the comparison voltage; and
    an output switching circuit which switches an output voltage from a first potential level to a second potential level in response to elapse of a delay time of said first chopper comparator after excess of the comparison voltage over the reference voltage of said first chopper comparator, and switches the output voltage from the second potential level to the first potential level in response to elapse of a delay time of said second chopper comparator after falling of the comparison voltage below the reference voltage of said second chopper comparator.

3. A voltage controlled oscillator circuit comprising:
    a first chopper comparator supplied with a reference voltage having a relatively high potential level, which first chopper comparator assuming a comparison operation state in response to a rise of a comparison voltage depending upon the input voltage and assuming an auto zero state in response to a fall of the comparison voltage;
    a second chopper comparator supplied with a reference voltage having a relatively low potential level, which second chopper comparator assuming an auto zero state in response to a rise of the comparison voltage and assuming a comparison operation state in response to a fall of the comparison voltage; and
    an output switching circuit which switches the output voltage from a first potential level to a second potential level in response to elapse of a delay time of said first chopper comparator after excess of the comparison voltage over the reference voltage of said first chopper comparator, and switches the output voltage from the second potential level to the first potential level in response to elapse of a delay time of said second chopper comparator after falling of the comparison voltage below the reference voltage of said second chopper comparator;
    wherein said first chopper comparator and said second chopper comparator are switched from the comparison operation state to the auto zero state and vice versa in synchronism with the voltage output from said output switching circuit.

4. A voltage controlled oscillator circuit comprising:
    a first chopper comparator supplied with a reference voltage having a relatively high potential level, which first chopper comparator assuming a comparison operation state in response to a rise of a comparison voltage depending upon the input voltage and assuming an auto zero state in response to a fall of the comparison voltage;
    a second chopper comparator supplied with a reference voltage having a relatively low potential level, which second chopper comparator assuming an auto zero state in response to a rise of the comparison voltage and assuming a comparison operation state in response to a fall of the comparison voltage;

an output switching circuit which switches an output voltage from a first potential level to a second potential level in response to elapse of a delay time of said first chopper comparator after excess of the comparison voltage over the reference voltage of said first chopper comparator, and switches the output voltage from the second potential level to the first potential level in response to elapse of a delay time of said second chopper comparator after falling of the comparison voltage below the reference voltage of said second chopper comparator; and a logic circuit for generating a clock signal in synchronism with the voltage output from said output switching circuit;

wherein said first chopper comparator and said second chopper comparator are switched from the comparison operation state to the auto zero state and vice versa in synchronism with the voltage output from said output switching circuit;

wherein said clock signal being delayed by a predetermined time as compared with the voltage output from said output switching circuit, an operation state of said first chopper comparator being controlled by the clock signal, an operation state of said second chopper comparator being controlled by an inversion signal of the clock signal.

5. A voltage controlled oscillator circuit comprising:

a first chopper comparator supplied with a reference voltage having a relatively high potential level, which first chopper comparator assuming a comparison operation state in response to a rise of a comparison voltage depending upon the input voltage and assuming an auto zero state in response to a fall of the comparison voltage;

a second chopper comparator supplied with a reference voltage having a relatively low potential level, which second chopper comparator assuming an auto zero state in response to a rise of the comparison voltage and assuming a comparison operation state in response to a fall of the comparison voltage;

an output switching circuit which switches an output voltage from a first potential level to a second potential level in response to elapse of a delay time of said first chopper comparator after excess of the comparison voltage over the reference voltage of said first chopper comparator, and switches the output voltage from the second potential level to the first potential level in response to elapse of a delay time of said second chopper comparator after falling of the comparison voltage below the reference voltage of said second chopper comparator;

a current source;

a converter circuit which controls said current source so as to generate a current proportionate to the input voltage; and a capacitor which is charged or discharged based on the current from said current source and generates the comparison voltage based on the charging or discharging;

wherein said first chopper comparator and said-second cropper comparator are switched from the comparison operation state to the auto zero state and vice versa in synchronism with the voltage output from said output switching circuit.

* * * * *